(12) United States Patent
Nagasaka et al.

(10) Patent No.: US 9,977,352 B2
(45) Date of Patent: May 22, 2018

(54) EXPOSURE APPARATUS AND DEVICE MANUFACTURING METHOD

(71) Applicants: NIKON CORPORATION, Tokyo (JP); NIKON ENGINEERING CO., LTD., Yokohama-shi (JP)

(72) Inventors: Hiroyuki Nagasaka, Kumagaya (JP); Takeshi Okuyama, Yokohama (JP)

(73) Assignees: NIKON CORPORATION, Tokyo (JP); NIKON ENGINEERING CO., LTD., Yokohama-shi (JP)

( * ) Notice: Subject to any disclaimer, the term of this patent is extended or adjusted under 35 U.S.C. 154(b) by 0 days. days.

(21) Appl. No.: 15/354,396

(22) Filed: Nov. 17, 2016

(65) Prior Publication Data

US 2017/0068176 A1  Mar. 9, 2017

Related U.S. Application Data

(60) Division of application No. 14/812,366, filed on Jul. 29, 2015, now Pat. No. 9,500,959, which is a division (Continued)

(30) Foreign Application Priority Data

Jul. 9, 2003 (JP) ................................. 2003-272617

(51) Int. Cl.
*G03F 7/20* (2006.01)

(52) U.S. Cl.
CPC ...... *G03F 7/70883* (2013.01); *G03F 7/70341* (2013.01)

(58) Field of Classification Search
CPC ................................................ G03F 7/70341

(Continued)

(56) References Cited

U.S. PATENT DOCUMENTS 3,648,587 A    3/1972  Stevens
4,346,164 A    8/1982  Tabarelli et al.
(Continued)

FOREIGN PATENT DOCUMENTS

DE    221 563 C    4/1985
DE    224 448 C    7/1985
(Continued)

OTHER PUBLICATIONS

Jul. 14, 2015 Office Action issued in Japanese Patent Application No. 2013-257535.

(Continued)

*Primary Examiner* — Hung Henry Nguyen
(74) *Attorney, Agent, or Firm* — Oliff PLC

(57) ABSTRACT

A device manufacturing method forms a liquid immersion area under a projection system via which an exposure light is projected, while supplying a liquid via a liquid supply inlet of a liquid retaining member and collecting the supplied liquid along with a gas via a liquid recovery outlet of the liquid retaining member. The liquid retaining member surrounds a tip portion of the projection system, which has a last optical element having a surface. The liquid retaining member has a surface opposite to the surface of the last optical element with a gap between the surfaces. A substrate is exposed with the exposure light through the liquid of the liquid immersion area, while moving the substrate below and relative to the projection system and the liquid retaining member. One of the liquid and the gas is separated from the other which have been collected via the liquid recovery outlet.

16 Claims, 12 Drawing Sheets

Related U.S. Application Data of application No. 14/311,918, filed on Jun. 23, 2014, now Pat. No. 9,097,988, which is a division of application No. 13/449,041, filed on Apr. 17, 2012, now Pat. No. 8,797,505, which is a division of application No. 12/320,771, filed on Feb. 4, 2009, now Pat. No. 8,218,127, which is a division of application No. 11/325,474, filed on Jan. 5, 2006, now Pat. No. 7,508,490, which is a continuation of application No. PCT/JP2004/010057, filed on Jul. 8, 2004.

(58) Field of Classification Search
USPC .................................................. 355/30, 53
See application file for complete search history.

(56) References Cited

U.S. PATENT DOCUMENTS

| | | | |
|---|---|---|---|
| 4,480,910 A | | 11/1984 | Takanashi et al. |
| 4,509,852 A | | 4/1985 | Tabarelli et al. |
| 4,704,140 A | | 11/1987 | Kujala |
| 5,312,552 A | * | 5/1994 | Norman .............. B01D 17/00 |
| | | | 210/104 |
| 5,528,118 A | | 6/1996 | Lee |
| 5,610,683 A | * | 3/1997 | Takahashi ........... G03F 7/70341 |
| | | | 355/53 |
| 5,623,853 A | | 4/1997 | Novak et al. |
| 5,715,039 A | | 2/1998 | Fukuda et al. |
| 5,825,043 A | | 10/1998 | Suwa |
| 5,874,820 A | | 2/1999 | Lee |
| 5,938,922 A | | 8/1999 | Fulk, Jr. et al. |
| 5,969,441 A | | 10/1999 | Loopstra et al. |
| 6,208,407 B1 | | 3/2001 | Loopstra |
| 6,341,007 B1 | | 1/2002 | Nishi et al. |
| 6,400,441 B1 | | 6/2002 | Nishi et al. |
| 6,549,269 B1 | | 4/2003 | Nishi et al. |
| 6,590,634 B1 | | 7/2003 | Nishi et al. |
| 6,867,844 B2 | | 3/2005 | Vogel et al. |
| 6,940,582 B1 | | 9/2005 | Tanaka |
| 7,038,759 B2 | | 5/2006 | Emoto et al. |
| 9,097,988 B2 | | 8/2015 | Nagasaka et al. |
| 2001/0045743 A1 | | 11/2001 | Wieder |
| 2002/0163629 A1 | | 11/2002 | Switkes et al. |
| 2003/0007136 A1 | | 1/2003 | Emoto et al. |
| 2003/0030916 A1 | | 2/2003 | Suenaga |
| 2003/0174408 A1 | | 9/2003 | Rostalski et al. |
| 2004/0000627 A1 | | 1/2004 | Schuster |
| 2004/0075895 A1 | | 4/2004 | Lin |
| 2004/0109237 A1 | | 6/2004 | Epple et al. |
| 2004/0114117 A1 | | 6/2004 | Bleeker |
| 2004/0118184 A1 | | 6/2004 | Violette |
| 2004/0119954 A1 | | 6/2004 | Kawashima et al. |
| 2004/0125351 A1 | | 7/2004 | Krautschik |
| 2004/0136494 A1 | | 7/2004 | Lof et al. |
| 2004/0160582 A1 | | 8/2004 | Lof et al. |
| 2004/0165159 A1 | | 8/2004 | Lof et al. |
| 2004/0169834 A1 | | 9/2004 | Richter et al. |
| 2004/0169924 A1 | | 9/2004 | Flagello et al. |
| 2004/0180294 A1 | | 9/2004 | Baba-Ali et al. |
| 2004/0180299 A1 | | 9/2004 | Rolland et al. |
| 2004/0207824 A1 | | 10/2004 | Lof et al. |
| 2004/0211920 A1 | | 10/2004 | Maria Derksen et al. |
| 2004/0224265 A1 | | 11/2004 | Endo et al. |
| 2004/0224525 A1 | | 11/2004 | Endo et al. |
| 2004/0227923 A1 | | 11/2004 | Flagello et al. |
| 2004/0233405 A1 | | 11/2004 | Kato et al. |
| 2004/0253547 A1 | | 12/2004 | Endo et al. |
| 2004/0253548 A1 | | 12/2004 | Endo et al. |
| 2004/0257455 A1 | | 12/2004 | Aoyama |
| 2004/0257544 A1 | | 12/2004 | Vogel et al. |
| 2004/0259008 A1 | | 12/2004 | Endo et al. |
| 2004/0259040 A1 | | 12/2004 | Endo et al. |
| 2004/0263808 A1 | | 12/2004 | Sewell |
| 2004/0263809 A1 | | 12/2004 | Nakano |
| 2005/0002004 A1 | | 1/2005 | Kolesnychenko et al. |
| 2005/0007569 A1 | | 1/2005 | Streefkerk et al. |
| 2005/0007570 A1 | | 1/2005 | Streefkerk et al. |
| 2005/0018155 A1 | | 1/2005 | Cox et al. |
| 2005/0018156 A1 | | 1/2005 | Mulkens et al. |
| 2005/0024609 A1 | | 2/2005 | De Smit et al. |
| 2005/0030497 A1 | | 2/2005 | Nakamura |
| 2005/0030498 A1 | | 2/2005 | Mulkens |
| 2005/0030506 A1 | | 2/2005 | Schuster |
| 2005/0036121 A1 | | 2/2005 | Hoogendam et al. |
| 2005/0036183 A1 | | 2/2005 | Yeo et al. |
| 2005/0036184 A1 | | 2/2005 | Yeo et al. |
| 2005/0036213 A1 | | 2/2005 | Mann et al. |
| 2005/0037269 A1 | | 2/2005 | Levinson |
| 2005/0042554 A1 | | 2/2005 | Dierichs et al. |
| 2005/0046934 A1 | | 3/2005 | Ho et al. |
| 2005/0048223 A1 | | 3/2005 | Pawloski et al. |
| 2005/0068639 A1 | | 3/2005 | Pierrat et al. |
| 2005/0073670 A1 | | 4/2005 | Carroll |
| 2005/0084794 A1 | | 4/2005 | Meagley et al. |
| 2005/0094116 A1 | | 5/2005 | Flagello et al. |
| 2005/0100745 A1 | | 5/2005 | Lin et al. |
| 2005/0110973 A1 | | 5/2005 | Streefkerk et al. |
| 2005/0117224 A1 | | 6/2005 | Shafer et al. |
| 2005/0122497 A1 | | 6/2005 | Lyons et al. |
| 2005/0132914 A1 | | 6/2005 | Mulkens et al. |
| 2005/0134815 A1 | | 6/2005 | Van Santen et al. |
| 2005/0134817 A1 | | 6/2005 | Nakamura |
| 2005/0141098 A1 | | 6/2005 | Schuster |
| 2005/0145265 A1 | | 7/2005 | Ravkin et al. |
| 2005/0145803 A1 | | 7/2005 | Hakey et al. |
| 2005/0146694 A1 | | 7/2005 | Tokita |
| 2005/0146695 A1 | | 7/2005 | Kawakami |
| 2005/0147920 A1 | | 7/2005 | Lin et al. |
| 2005/0153424 A1 | | 7/2005 | Coon |
| 2005/0158673 A1 | | 7/2005 | Hakey et al. |
| 2005/0164502 A1 | | 7/2005 | Deng et al. |
| 2005/0174549 A1 | | 8/2005 | Duineveld et al. |
| 2005/0175940 A1 | | 8/2005 | Dierichs |
| 2005/0185269 A1 | | 8/2005 | Epple et al. |
| 2005/0190435 A1 | | 9/2005 | Shafer et al. |
| 2005/0190455 A1 | | 9/2005 | Rostalski et al. |
| 2005/0205108 A1 | | 9/2005 | Chang et al. |
| 2005/0213061 A1 | | 9/2005 | Hakey et al. |
| 2005/0213072 A1 | | 9/2005 | Schenker et al. |
| 2005/0217135 A1 | | 10/2005 | O'Donnell et al. |
| 2005/0217137 A1 | | 10/2005 | Smith et al. |
| 2005/0217703 A1 | | 10/2005 | O'Donnell |
| 2005/0219481 A1 | | 10/2005 | Cox et al. |
| 2005/0219482 A1 | | 10/2005 | Baselmans et al. |
| 2005/0219488 A1 | | 10/2005 | Nei et al. |
| 2005/0219490 A1 | | 10/2005 | Owa |
| 2005/0219499 A1 | | 10/2005 | Maria Zaal et al. |
| 2005/0225734 A1 | | 10/2005 | De Smit et al. |
| 2005/0225737 A1 | | 10/2005 | Weissenrieder et al. |
| 2005/0231694 A1 | | 10/2005 | Kolesnychenko et al. |
| 2005/0237501 A1 | | 10/2005 | Furukawa et al. |
| 2005/0243292 A1 | | 11/2005 | Baselmans et al. |
| 2005/0245005 A1 | | 11/2005 | Benson |
| 2005/0253090 A1 | | 11/2005 | Gau et al. |
| 2005/0259232 A1 | | 11/2005 | Streefkerk et al. |
| 2005/0259233 A1 | | 11/2005 | Streefkerk et al. |
| 2005/0264778 A1 | | 12/2005 | Lof et al. |
| 2005/0270505 A1 | | 12/2005 | Smith |
| 2005/0282405 A1 | | 12/2005 | Harpham et al. |
| 2006/0082746 A1 | | 4/2006 | Mertens et al. |
| 2006/0261288 A1 | | 11/2006 | Van Santen |
| 2007/0132974 A1 | | 6/2007 | Hazelton et al. |
| 2009/0002655 A1 | | 1/2009 | Nagasaka et al. |

FOREIGN PATENT DOCUMENTS

| | | |
|---|---|---|
| EP | 0 605 103 A1 | 7/1994 |
| EP | 0 951 054 A1 | 10/1999 |
| EP | 1137054 A1 | 9/2001 |
| EP | 1 276 016 A2 | 1/2003 |
| EP | 1 571 701 A1 | 9/2005 |
| EP | 1571698 A1 | 9/2005 |
| EP | 1 598 855 A1 | 11/2005 |
| EP | 1 612 850 A1 | 1/2006 |

(56) References Cited

FOREIGN PATENT DOCUMENTS

| | | |
|---|---|---|
| EP | 1 641 028 A1 | 3/2006 |
| JP | S57-153433 A | 9/1982 |
| JP | S58-202448 A | 11/1983 |
| JP | S59-19912 A | 2/1984 |
| JP | S62-65326 A | 3/1987 |
| JP | S63-157419 A | 6/1988 |
| JP | H04-305915 A | 10/1992 |
| JP | H04-305917 A | 10/1992 |
| JP | H05-62877 A | 3/1993 |
| JP | H06-124873 A | 5/1994 |
| JP | H06-168866 A | 6/1994 |
| JP | H07-220990 A | 8/1995 |
| JP | 08-000905 A | 1/1996 |
| JP | H08-166475 A | 6/1996 |
| JP | H08-316125 A | 11/1996 |
| JP | H08-330224 A | 12/1996 |
| JP | H10-163099 A | 6/1998 |
| JP | H10-214783 A | 8/1998 |
| JP | H10-303114 A | 11/1998 |
| JP | H10-314503 A | 12/1998 |
| JP | H10-340846 A | 12/1998 |
| JP | H11-176727 A | 7/1999 |
| JP | 2000-058436 A | 2/2000 |
| JP | 2000-505958 A | 5/2000 |
| JP | 2001-189299 A | 7/2001 |
| JP | 2001179252 A | 7/2001 |
| JP | 2002-066428 A | 3/2002 |
| JP | 2003086486 A | 3/2003 |
| JP | 2003136058 A | 5/2003 |
| JP | 2004-165666 A | 6/2004 |
| JP | 2004282023 A | 10/2004 |
| JP | 2004-349645 A | 12/2004 |
| JP | 2005-005713 A | 1/2005 |
| JP | 2005-019615 A | 1/2005 |
| JP | 2005-019616 A | 1/2005 |
| JP | 2005-101488 A | 4/2005 |
| JP | 2006-510146 A | 3/2006 |
| WO | 98/24115 A1 | 6/1998 |
| WO | 98/28665 A1 | 7/1998 |
| WO | 99/49504 A1 | 9/1999 |
| WO | 2004/019128 A1 | 9/1999 |
| WO | 01/22480 A1 | 3/2001 |
| WO | 2002/091078 A1 | 11/2002 |
| WO | 2003/077037 A1 | 9/2003 |
| WO | 2004/053956 A1 | 6/2004 |
| WO | 2004/055803 A1 | 7/2004 |
| WO | 2004/057589 A1 | 7/2004 |
| WO | 2004/057590 A1 | 7/2004 |
| WO | 2004/077154 A2 | 9/2004 |
| WO | 2004/081666 A1 | 9/2004 |
| WO | 2004/090577 A2 | 10/2004 |
| WO | 2004/090633 A2 | 10/2004 |
| WO | 2004/090634 A2 | 10/2004 |
| WO | 2004/092830 A2 | 10/2004 |
| WO | 2004/092833 A2 | 10/2004 |
| WO | 2004/093130 A2 | 10/2004 |
| WO | 2004/093159 A2 | 10/2004 |
| WO | 2004/093160 A2 | 10/2004 |
| WO | 2004/095135 A2 | 11/2004 |
| WO | 2005/001432 A2 | 1/2005 |
| WO | 2005/001572 A2 | 1/2005 |
| WO | 2005/003864 A2 | 1/2005 |
| WO | 2005/006026 A2 | 1/2005 |
| WO | 2005/008339 A2 | 1/2005 |
| WO | 2005/013008 A2 | 2/2005 |
| WO | 2005/015283 A1 | 2/2005 |
| WO | 2005/017625 A2 | 2/2005 |
| WO | 2005/019935 A2 | 3/2005 |
| WO | 2005/022266 A2 | 3/2005 |
| WO | 2005/024325 A2 | 3/2005 |
| WO | 2005/024517 A2 | 3/2005 |
| WO | 2005/034174 A2 | 4/2005 |
| WO | 2005/050324 A2 | 6/2005 |
| WO | 2005/054953 A2 | 6/2005 |
| WO | 2005/054955 A2 | 6/2005 |
| WO | 2005/059617 A2 | 6/2005 |
| WO | 2005/059618 A2 | 6/2005 |
| WO | 2005/059645 A2 | 6/2005 |
| WO | 2005/059654 A1 | 6/2005 |
| WO | 2005/062128 A2 | 7/2005 |
| WO | 2005/064400 A2 | 7/2005 |
| WO | 2005/064405 A2 | 7/2005 |
| WO | 2005/069055 A2 | 7/2005 |
| WO | 2005/069078 A1 | 7/2005 |
| WO | 2005/069081 A2 | 7/2005 |
| WO | 2005/071491 A2 | 8/2005 |
| WO | 2005/074606 A2 | 8/2005 |
| WO | 2005/076084 A1 | 8/2005 |
| WO | 2005/081030 A1 | 9/2005 |
| WO | 2005/081067 A1 | 9/2005 |
| WO | 2005/098504 A1 | 10/2005 |
| WO | 2005/098505 A1 | 10/2005 |
| WO | 2005/098506 A1 | 10/2005 |
| WO | 2005/106589 A1 | 11/2005 |
| WO | 2005/111689 A2 | 11/2005 |
| WO | 2005/111722 A2 | 11/2005 |
| WO | 2005/119368 A2 | 12/2005 |
| WO | 2005/119369 A1 | 12/2005 |

OTHER PUBLICATIONS

Dec. 15, 2015 Office Action issued in Japanese Patent Application No. 2013-257535.
Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.
Nikon Corporation, 3rd 157 nm symposium, Sep. 4, 2002, "Nikon F2 Exposure Tool", Soichi Owa et al., 25 pages (slides 1 25).
Nikon Corporation, Immersion Lithography Workshop, Dec. 11, 2002, 24 pages (slides 1-24).
Optical Microlithography XVI, Proceedings of SPIE vol. 5040 (2003), "Immersion lithography; its potential performance and issues", Soichi Owa et al., pp. 724-733.
Nikon Corporation, Immersion Workshop, Jan. 27, 2004, "Update on 193 nm immersion exposure tool", S. Owa et al., 38 pages (slides 1-38).
Nikon Corporation, Litho Forum, Jan. 28, 2004, "Update on 193 nm immersion exposure tool", S. Owa et al., 51 pages (slides 1-51).
Nikon Corporation, NGL Workshop, Jul. 10, 2003, :Potential performance and feasibility of immersion lithography, Soichi Owa et al., 33 pages, slides 1-33.
European Search Report, dated Dec. 27, 2007.
Nov. 25, 2008 Office Action issued in Japanese Application No. 2005-511580.
May 19, 2009 Office Action issued in Japanese Application No. 2005-511580.
May 6, 2010 Notice of Allowance issued in Japanese Application No. 2005-511580.
Apr. 25, 2008 Office Action issued in European Application No. 04 747 523.1-1226.
Dec. 4, 2007 Office Action issued in U.S. Appl. No. 11/325,474.
Jul. 23, 2008 Notice of Allowance issued in U.S. Appl. No. 11/325,474.
Nov. 5, 2008 Notice of Allowance issued in U.S. Appl. No. 11/325,474.
Oct. 5, 2004 International Search Report issued in International Patent Application No. PCT/JP2004/010057.
Oct. 5, 2004 Written Opinion in International Patent Application No. PCT/JP2004/010057.
Mar. 15, 2011 Office Action issued in Japanese Application No. 2009-013528.

(56) References Cited

OTHER PUBLICATIONS

Apr. 12, 2011 Search Report issued in European Application No. 10183482.8.
Apr. 12, 2011 Search Report issued in European Application No. 10183476.0.
Jul. 5, 2011 Notice of Allowance issued in Japanese Patent Application No. 2009-013528.
Aug. 11, 2011 Office Action issued in parent U.S. Appl. No. 12/320,771.
Mar. 12, 2012 Notice of Allowance issued in parent U.S. Appl. No. 12/320,771.
Nov. 7, 2013 Office Action issued in U.S. Appl. No. 13/449,041.
Mar. 20, 2014 Notice of Allowance issued in U.S. Appl. No. 13/449,041.
Current Claims of U.S. Appl. No. 11/785,722 filed with USPTO Nov. 28, 2011.
Office Action dated Apr. 17, 2008 in U.S. Appl. No. 11/785,722.
Office Action dated Oct. 14, 2008 in U.S. Appl. No. 11/785,722.
Office Action dated Jul. 14, 2009 in U.S. Appl. No. 11/785,722.
Office Action dated Feb. 4, 2010 in U.S. Appl. No. 11/785,722.
Office Action dated Oct. 25, 2010 in U.S. Appl. No. 11/785,722.
Office Action dated May 26, 2011 in U.S. Appl. No. 11/785,722.
Aug. 13, 2013 Office Action issued in Japanese Patent Application No. 2010-255406.
Jul. 15, 2014 Office Action issued in Japanese Patent Application No. 2013-22619.
Feb. 3, 2015 Office Action issued in Japanese Application No. 2013-257535.
Jan. 6, 2015 Office Action issued in Japanese Application No. 2013-226196.
Dec. 9, 2014 Notice of Allowance issued in U.S. Appl. No. 14/311,918.
Mar. 30, 2015 Notice of Allowance issued in U.S. Appl. No. 14/311,918.
Mar. 21, 2016 Office Action issued in U.S. Appl. No. 14/812,366.
Jul. 22, 2016 Notice of Allowance issued in U.S. Appl. No. 14/812,366.
Jan. 24, 2017 Office Action issued in Japanese Patent Application No. 2015-231233.
Nov. 14, 2017 Office Action issued in Japanese Application No. 2016-219762.

* cited by examiner

EXPOSURE APPARATUS AND DEVICE MANUFACTURING METHOD

CROSS-REFERENCE TO RELATED APPLICATION

This is a Divisional of U.S. patent application Ser. No. 14/812,366 filed Jul. 29, 2015 (now U.S. Pat. No. 9,500,959), which in turn is a Divisional of U.S. patent application Ser. No. 14/311,918 filed Jun. 23, 2014 (now U.S. Pat. No. 9,097,988), which in turn is a Divisional of U.S. patent application Ser. No. 13/449,041 filed Apr. 17, 2012 (now U.S. Pat. No. 8,797,505), which in turn is a Divisional of U.S. patent application Ser. No. 12/320,771 filed Feb. 4, 2009 (now U.S. Pat. No. 8,218,127), which is a Divisional of U.S. patent application Ser. No. 11/325,474 filed Jan. 5, 2006 (now U.S. Pat. No. 7,508,490), which is a Continuation of International Application No. PCT/JP2004/010057, filed Jul. 8, 2004, which claims priority to Japanese Patent Application No. 2003-272617 (filed on Jul. 9, 2003). The contents of each of the aforementioned applications are incorporated herein by reference in their entireties.

BACKGROUND OF THE INVENTION

Field of the Invention

The present invention relates to an exposure apparatus that exposes a pattern on a substrate via a projection optical system and a liquid and to device manufacturing method.

Description of Related Art

The semiconductor device or the liquid crystal display device is manufactured by the technique known as photolithography, in which a pattern formed on a mask is transferred onto a photosensitive substrate. The exposure apparatus used in this photolithography process has a mask stage that supports a mask and a substrate stage that supports a substrate, and it transfers a mask pattern to a substrate via a projection optical system while sequentially moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA, \quad (1)$$

$$\delta = \pm k_2 \cdot \lambda / NA^2, \quad (2)$$

In the expressions, $\lambda$ represents the exposure wavelength, NA represents the numerical aperture of the projection optical system, and $k_1$ and $k_2$ represent the process coefficients. According to the expressions (1) and (2), the following fact is appreciated. That is, when the exposure wavelength $\lambda$ is shortened and the numerical aperture NA is increased in order to enhance the resolution R, then the depth of focus $\delta$ is narrowed.

If the depth of focus $\delta$ is too narrowed, it is difficult to match the substrate surface with respect to the image plane of the projection optical system. It is feared that the margin is insufficient during the exposure operation. Accordingly, the liquid immersion method has been suggested, which is disclosed, for example, in PCT International Publication No. WO99/49504 as a method for substantially shortening the exposure wavelength and widening the depth of focus. In this liquid immersion method, the space between the lower surface of the projection optical system and the substrate surface is filled with a liquid such as water or any organic solvent to form a liquid immersion area so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases). As far as is permitted by the law of the country specified or selected in this patent application, the disclosures in PCT International Publication No. WO99/49504 are incorporated herein by reference.

If the supply of liquid from the supply port of the liquid supply mechanism is uneven when the liquid is supplied onto the substrate to form a liquid immersion region, there is a possibility of occurrence of an inconvenience such as the formation of the liquid immersion region becoming inadequate, leading to deterioration of the pattern image exposed onto the substrate. For this reason, even (uniform) supply of liquid from the supply port of the liquid supply mechanism is also in demand. The prevention of mixing in of impurities such as bubbles, etc. into the liquid immersion region is also in demand in order to prevent deterioration of the pattern image exposed on the substrate.

Furthermore, it is also important that the liquid on the substrate be recovered well. When the liquid cannot be adequately recovered, for example, the liquid that remains on the substrate dries, a water mark is produced there, and an inconvenience in which the remaining liquid is scattered to the peripheral mechanical components when, for example, the substrate is conveyed and rust is caused also occurs. In addition, when liquid remains and is scattered, there is a possibility that the measuring operations relating to exposure processing will be affected, such as by fluctuations being brought about in the environment (temperature, etc.) in which the substrate is placed, causing changes in the refractive index on the optical path of the detection light of the optical interferometer used in stage position measurement, thereby causing exposure precision to degraded.

SUMMARY OF THE INVENTION

The present invention was made taking such circumstances into account, and its purpose is to provide an exposure apparatus that is able to prevent pattern image deterioration and perform exposure processing with good accuracy when the pattern is exposed onto a substrate via a projection optical system and a liquid, and to provide a device manufacturing method.

The first aspect of the present invention is an exposure apparatus that exposes a substrate by forming a liquid immersion region on the substrate, and projecting a pattern image onto the substrate via a projection optical system and a liquid that forms the liquid immersion region, the exposure apparatus including: a liquid supply mechanism that has a supply port arranged to oppose a surface of the substrate;

and a buffer space formed in a channel of the liquid supply mechanism, wherein the liquid is supplied to the supply port after reserving a prescribed amount or more of liquid in the buffer space.

According to this aspect, when liquid is supplied from the supply port that opposes the substrate surface, by supplying the liquid after reserving a prescribed amount or more in the buffer space, the flow volume distribution and the flow rate distribution of the liquid with respect to the supply port can be made uniform. Therefore, the liquid can be evenly supplied onto the substrate from the supply port.

The second aspect of the present invention is an exposure apparatus that exposes a substrate by forming a liquid immersion region on the substrate, and projecting a pattern image onto the substrate via a projection optical system and a liquid that forms the liquid immersion region, the exposure apparatus including: a liquid supply mechanism that has a supply port arranged to oppose a surface of the substrate; and a channel being connected to the supply port of the liquid supply mechanism, the channel having a corner and a channel portion disposed in vicinity of the corner, the channel portion being made narrower than the channel in front thereof.

According to this aspect, bubbles are likely to remain in the vicinity of the corner of the channel, but the flow rate of the liquid is increased by narrowing the channel in the vicinity of this corner, and the bubbles can be discharged to the exterior via the supply port due to the increased flow rate of the liquid. Therefore, by performing the liquid immersion exposure operation after the bubbles are discharged from the channel, mixing of the bubbles from the channel into the liquid immersion region can be prevented, and exposure processing can be performed in a status in which bubbles are not present in the liquid immersion region.

The third aspect of the present invention is an exposure apparatus that exposes a substrate by projecting a pattern image onto the substrate via a projection optical system and a liquid, the exposure apparatus including: a liquid supply mechanism that is arranged in vicinity of a terminating end of the projection optical system and supplies the liquid; and a minute gap that is formed between a side surface of the liquid supply mechanism and a side surface of an optical member of the terminating end, which comes into contact with the liquid, of the projection optical system, wherein at least one of the side surface of the liquid supply mechanism and the side surface of the optical member of the terminating end is liquid repellence treated.

According to this aspect, due to the minute gap formed between the liquid supply mechanism and the projection optical system, the vibration that is generated by the liquid supply mechanism is not transmitted to the projection optical system, thus the substrate can be exposed well. Also, by performing liquid repellence treatment for at least one of the side surface of the liquid supply mechanism and the side surface of the optical member of the terminating end that form this minute gap, it is possible to prevent penetration of the liquid into the minute gap. If liquid has penetrated into the minute gap, there is a possibility that an inconvenience will occur, wherein the penetrated liquid is in a stagnant state, the degree of cleanliness drops, and the liquid in the minute gap of which that degree of cleanliness has dropped mixes into the liquid immersion region, for example, during liquid immersion exposure. However, penetration of the liquid to the minute gap can be prevented by performing liquid repellence treatment, so it is possible to prevent the occurrence of the aforementioned inconvenience.

The fourth aspect of the present invention is an exposure apparatus that exposes a substrate by projecting a pattern image onto the substrate via a projection optical system and a liquid, the exposure apparatus including: a liquid recovery mechanism that is arranged in the vicinity of a terminating end of the projection optical system and that recovers the liquid; and a minute gap is formed between a side surface of the liquid recovery mechanism and a side surface of the optical member of the terminating end, which comes into contact with the liquid, of the projection optical system, wherein at least one of the side surface of the liquid recovery mechanism and the side surface of the optical member of the terminating end is liquid repellence treated.

Specifically, what is arranged in the vicinity of the terminating end of the projection optical system is not limited to a liquid supply mechanism, it may also be a liquid recovery mechanism, and, in this case as well, it is possible to prevent penetration of the liquid into the minute gap by performing liquid repellence treatment for at least one of the side surface of the liquid recovery mechanism and the side surface of the optical member of the terminating end that form the minute gap.

The fifth aspect of the present invention is an exposure apparatus that exposes a substrate by projecting a pattern image onto the substrate via a projection optical system and a liquid, the exposure apparatus including: a liquid recovery mechanism that recovers the liquid on the substrate along with a gas in vicinity thereof and has a separator that separates a recovered liquid and a recovered gas.

According to this aspect, since, in the case where the liquid recovery mechanism, for example, performs the recovery by sucking in the liquid on the substrate along with the gas in the vicinity thereof by means of a vacuum system, the separator that separates the recovered liquid and gas is provided in that liquid recovery mechanism, it is possible to prevent the penetration of liquid to the vacuum system such as a vacuum pump. Therefore, it is possible to well maintain the recovery operation of the liquid recovery mechanism for a long period of time while preventing the occurrence of inconvenience such as malfunctions of the vacuum system, and it is possible to prevent deterioration of the pattern image due to the residual liquid on the substrate, or the like.

The sixth aspect of the present invention is an exposure apparatus that exposes a substrate by projecting a pattern image onto the substrate via a liquid, the exposure apparatus including: a projection optical system that projects the pattern image onto the substrate via the liquid; and a gap formed between a side surface of an optical member, that comes into contact with the liquid, among a plurality of optical elements of the projection optical system and a surface of an object in opposition thereto, permeation of the liquid to the gap being restricted.

According to this aspect, it is possible to prevent inconvenience such as the one whereby the liquid that has penetrated to the side surface of the optical member remains there, the degree of cleanliness of that liquid drops, and that liquid with a reduced degree of cleanliness is mixed into the liquid in forming the liquid immersion region on the substrate, for example.

The seventh aspect of the present invention is a device manufacturing method, and it uses the exposure apparatus described above. According to this aspect, it is possible to provide a device that has a pattern formed with good pattern accuracy that is able to exhibit the desired performance.

DETAILED DESCRIPTION OF THE INVENTION

Figure 1:
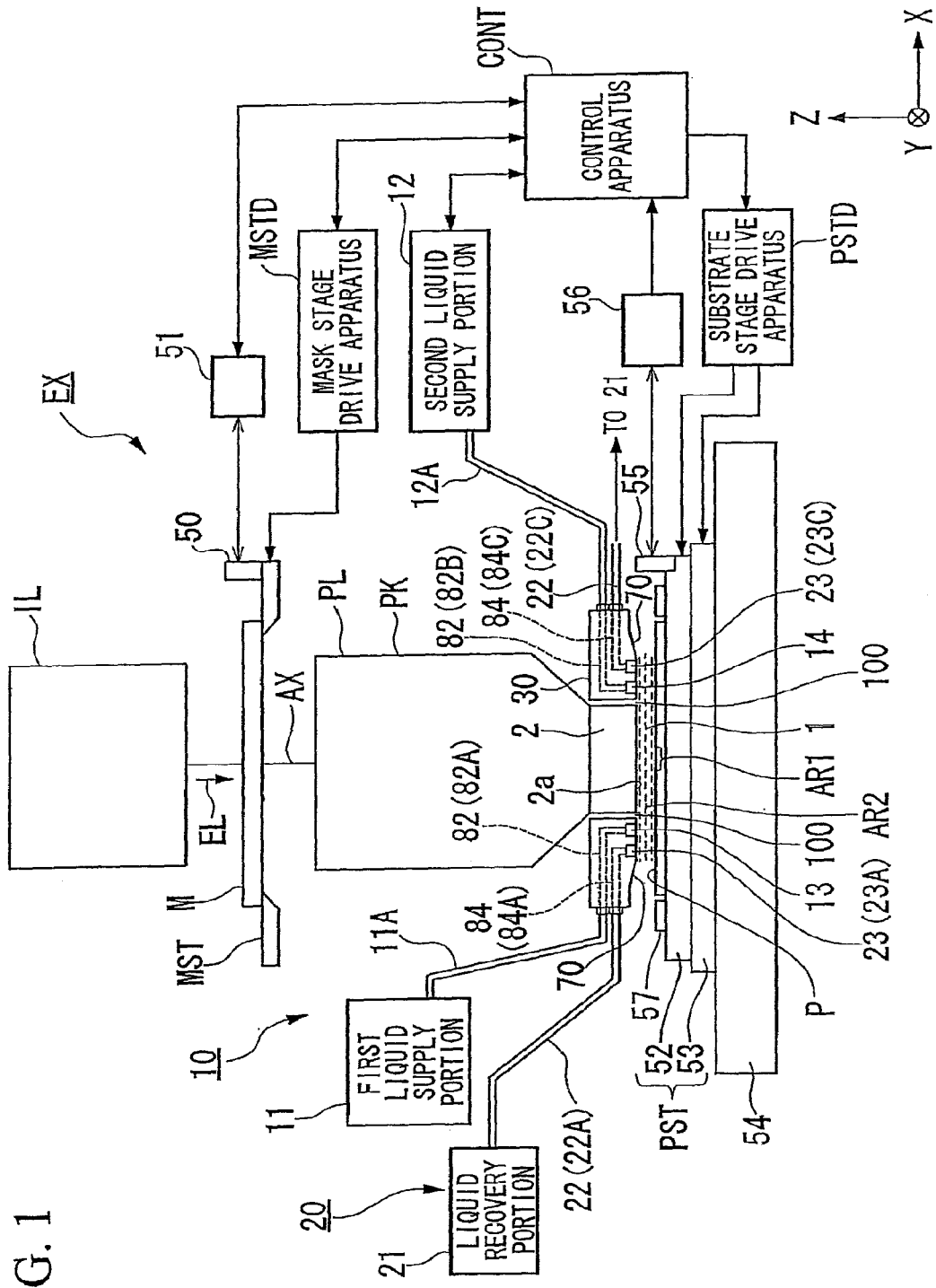
FIG. 1 is a schematic block diagram that shows one embodiment of the exposure apparatus of the present invention.

The exposure apparatus of the present invention will be explained below while referring to the drawings. However, the present invention is not limited to the respective embodiments below, and, for example, the constituent elements of these embodiments may be appropriately combined.

FIG. 1 is a schematic block diagram that shows one embodiment of the exposure apparatus of the present invention.

In FIG. 1, the exposure apparatus EX is provided with a mask stage MST that supports a mask M, a substrate stage PST that supports a substrate P, an illumination optical system IL that uses exposure light EL to illuminate the mask M that is supported by the mask stage MST, a projection optical system PL that projection exposes the pattern image of the mask M illuminated by the exposure light EL onto the substrate P supported on the substrate stage PST, and a control apparatus CONT that comprehensively controls operation of the entire exposure apparatus EX.

The exposure apparatus EX of the present embodiment is a liquid immersion exposure apparatus that applies the liquid immersion method to effectively shorten the exposure wavelength to improve resolution as it effectively broadens the depth of focus, and it is provided with a liquid supply mechanism 10 that supplies a liquid 1 onto the substrate P and a liquid recovery mechanism 20 that recovers the liquid 1 on the substrate P. The exposure apparatus EX fills the space of the optical path on the image plane side of the projection optical system PL with a liquid 1, using the liquid 1 supplied from the liquid supply mechanism 10, to form a liquid immersion region AR2 on a portion of the substrate P that includes the projection region AR1 of the projection optical system PL at least while the pattern image of the mask M is being transferred onto the substrate P. Specifically, the exposure apparatus EX fills in a liquid 1 between the optical element (optical member) 2 of the terminating end portion of the projection optical system PL and the surface of the substrate P and exposes the substrate P by projecting the pattern image of the mask M onto the substrate P via the projection optical system PL and the liquid 1 between this projection optical system PL and the substrate P.

Here, in this embodiment, an explanation will be given which uses as an example the case of a scanning exposure apparatus (a so-called scanning stepper) that, as the exposure apparatus EX, synchronously moves the mask M and the substrate P in respective scanning directions that are mutually different directions (opposite directions) while exposing the pattern formed on the mask M onto the substrate P. In the following explanation, the direction that matches the optical axis AX of the projection optical system PL is the Z axis direction, the synchronous movement direction (scanning direction) of the mask M and the substrate P within a plane perpendicular to the Z axis direction is the X axis direction, and the direction (non-scanning direction) perpendicular to the Z axis direction and the X axis direction is the Y axis direction. In addition, the rotation (tilting) directions around the X axis, Y axis and Z axis are the θX, θY and θZ directions respectively. Note that the "substrate" mentioned here includes substrates obtained by coating a semiconductor wafer with a photoresist as a photosensitive material, and the "mask" includes reticles formed with a device pattern to be subjected to the reduction projection onto the substrate.

The illumination optical system IL is used so that the mask M, which is supported on the mask stage MST, is illuminated with the exposure light beam EL. The illumination optical system IL includes an exposure light source, an optical integrator which uniformizes the illuminance of the light flux radiated from the exposure light source, a condenser lens which collects the exposure light beam EL come from the optical integrator, a relay lens system, a variable field diaphragm which sets the illumination area on the mask M illuminated with the exposure light beam EL to be slit-shaped, and the like. The predetermined illumination area on the mask M is illuminated with the exposure light beam EL having a uniform illuminance distribution by the illumination optical system IL. Those usable as the exposure light beam EL radiated from the illumination optical system IL include emission lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

The mask stage MST supports the mask M. The mask stage MST is two-dimensionally movable in the plane perpendicular to the optical axis AX of the projection optical system PL, i.e., in the XY plane, and it is finely rotatable in the θZ direction. The mask stage MST is driven by a mask stage-driving unit MSTD such as a linear motor. The mask stage-driving unit MSTD is controlled by the control unit CONT. A movement mirror 50 is provided on the mask stage MST. A laser interferometer 51 is provided at a position opposed to the movement mirror 50. The position in the two-dimensional direction and the angle of rotation of the mask M on the mask stage MST are measured in real-time by the laser interferometer 51. The result of the measurement is outputted to the control unit CONT. The control unit CONT drives the mask stage-driving unit MSTD on the basis of the result of the measurement obtained by the laser interferometer 51 to thereby position the mask M supported on the mask stage MST.

The projection optical system PL projection-exposes the pattern on the mask M onto the substrate P at a predetermined projection magnification β. The projection optical system PL is constituted by a plurality of optical elements including the optical element (lens) 2 provided at the terminating end portion on the side of the substrate P. The optical elements are supported by a barrel PK. In this embodiment, the projection optical system PL is the reduction system having the projection magnification β which is, for example, ¼ or ⅕. The projection optical system PL may be any one of the 1× magnification system and the magnifying system. The optical element 2, which is disposed at the end portion of the projection optical system PL of this embodiment, is provided detachably (exchangeably) with respect to the barrel PK. The liquid 1 in the liquid immersion area AR2 makes contact with the optical element 2.

In this embodiment, pure water is used for the liquid 1. Those capable of being transmitted through pure water include the ArF excimer laser beam as well as the emission line (g-ray, h-ray, i-ray) in the ultraviolet region radiated, for example, from a mercury lamp and the far ultraviolet light beam (DUV light beam) such as the KrF excimer laser beam (wavelength: 248 nm).

The optical element 2 is formed of fluorite. Fluorite has a high affinity for water. Therefore, the liquid 1 is successfully allowed to make tight contact with substantially the entire surface of the liquid contact surface 2a of the optical element 2. That is, in this embodiment, the liquid (water) 1, which has the high affinity for the liquid contact surface 2a of the optical element 2, is supplied. Therefore, the highly tight contact is effected between the liquid 1 and the liquid contact surface 2a of the optical element 2. The optical path between the optical element 2 and the substrate P can be reliably filled with the liquid 1. The optical element 2 may be formed of quartz (silica) having a high affinity for water. A water-attracting (lyophilic or liquid affinity) treatment may be applied to the liquid contact surface 2a of the optical element 2 to further enhance the affinity for the liquid 1.

The substrate stage PST supports the substrate P. The substrate stage PST includes a Z stage 52 which holds the substrate P by the aid of a substrate holder, an XY stage 53 which supports the Z stage 52, and a base 54 which supports the XY stage 53. The substrate stage PST is driven by a substrate stage-driving unit PSTD such as a linear motor. The substrate stage-driving unit PSTD is controlled by the control unit CONT. By driving the Z stage 52, the substrate P, which is held on the Z stage 52, is subjected to the control of the position (focus position) in the Z axis direction and the positions in the θX and θY directions. By driving the XY stage 53, the substrate P is subjected to the control of the position in the XY directions (position in the directions substantially parallel to the image plane of the projection optical system PL). That is, the Z stage 52 controls the focus position and the angle of inclination of the substrate P so that the surface of the substrate P is adjusted to match the image plane of the projection optical system PL in the auto-focus manner and the auto-leveling manner. The XY stage 53 positions the substrate P in the X axis direction and the Y axis direction. It goes without saying that the Z stage and the XY stage may be provided as an integrated body.

A movement mirror 55, which is movable together with the substrate stage PST with respect to the projection optical system PL, is provided on the substrate stage PST (Z stage 52). A laser interferometer 56 is provided at a position opposed to the movement mirror 55. The angle of rotation and the position in the two-dimensional direction of the substrate P on the substrate stage PST are measured in real-time by the laser interferometer 56. The result of the measurement is outputted to the control unit CONT. The control unit CONT drives the substrate stage-driving unit PSTD on the basis of the result of the measurement of the laser interferometer 56 to thereby position the substrate P supported on the substrate stage PST.

An auxiliary plate 57 is provided on the substrate stage PST (Z stage 52) so that the substrate P is surrounded thereby. The auxiliary plate 57 has a flat surface which has approximately the same height as that of the surface of the substrate P held by the substrate holder. In this arrangement, a gap of about 0.1 to 2 mm is provided between the auxiliary plate 57 and the edge of the substrate P. However, the liquid 1 scarcely flows into the gap owing to the surface tension of the liquid 1. Even when the vicinity of the circumferential edge of the substrate P is subjected to the exposure, the liquid 1 can be retained under the projection optical system PL by the aid of the auxiliary plate 57.

The liquid supply mechanism 10 supplies the prescribed liquid 1 onto the substrate P, and it is provided with a first liquid supply portion 11 and a second liquid supply portion 12 that are able to deliver the liquid 1 and a first and second supply tube 11A, 12A that respectively connect one end portion thereof to the first and second liquid supply portions 11, 12. The first and second liquid supply portions 11, 12 are respectively provided with a tank that accommodates the liquid 1, a pressurizing pump, etc.

The liquid recovery mechanism 20 recovers the liquid 1 on the surface of the substrate P, and it is provided with a liquid recovery portion 21 that is able to recover the liquid 1 and recovery tubes 22 (first through fourth recovery tubes 22A to 22D) that connect one end portion thereof to the liquid recovery portion 21. The liquid recovery portion 21 is provided with a suction apparatus (vacuum system) such as a vacuum pump and a tank that accommodates the recovered liquid 1.

A channel formation member 30 is arranged in the vicinity of the optical element 2 of the terminating end portion of the projection optical system PL.

The channel formation member 30 is a ring-shaped member provided so as to surround the optical element 2, and it is provided with a first supply port 13 and a second supply port 14 arranged to oppose the surface of the substrate P. In addition, the channel formation member 30 has supply channels 82 (82A, 82B) in the interior thereof. One end portion of the supply channel 82A is connected to the first supply port 13, and the other end portion is connected to the liquid supply portion 11 via the first supply tube 11A. One end portion of the supply channel 82B is connected to the second supply port 14, and the other end portion is connected to the second liquid supply portion 12 via the second supply tube 12A. In addition, the channel formation member 30 is provided with a recovery port 23 arranged to oppose the surface of the substrate P. In this embodiment, the channel formation member 30 has four recovery ports 23A to 23D. In addition, the channel formation member 30 has recovery channels 84 (84A to 84D) that correspond to the recovery port 23 (23A to 23D) in the interior thereof. One end portion of the recovery channels 84A to 84D is respectively connected to the recovery ports 23A to 23D, and the other end portion is respectively connected to the liquid recovery portion 21 via the recovery tubes 22A to 22D. In this embodiment, the channel formation member 30 comprises the respective portions of the liquid supply mechanism 10 and the liquid recovery mechanism 20.

Note that, in this embodiment, the first through fourth recovery tubes 22A to 22D are connected to one liquid recovery portion 21, but a plurality (four, here) of the liquid recovery portions 21 that correspond to the number of recovery tubes may be provided, and the respective first through fourth recovery tubes 22A to 22D may be respectively connected to the aforementioned plurality of liquid recovery portions 21.

The liquid supply operations of the first and second liquid supply portions 11, 12 are controlled by the control apparatus CONT. The control apparatus CONT is capable of respectively independent control of the liquid supply volume per unit time onto the substrate P from the first and second liquid supply portions 11, 12. The liquid 1 that is delivered from the first and second liquid supply portions 11, 12 is supplied onto the substrate P from the supply ports 13, 14 via the supply tubes 11A, 12A and the supply channels 82A, 82B of the channel formation member 30. In addition, the liquid recovery operation of the liquid recovery portion 21 is controlled by the control apparatus CONT. The control apparatus CONT is able to control the liquid recovery volume per unit time by the liquid recovery portion 21. The liquid 1 on the substrate P that has been recovered from the recovery port 23 is recovered by the liquid recovery portion 21 via the recovery channel 84 and the recovery tube 22 of the channel formation member 30.

A liquid trap surface 70 of a prescribed length that catches the liquid 1 unsuccessfully recovered by the recovery port 23 is formed on the lower surface (surface that faces the substrate P side) of the channel formation member 30 outside from the recovery port 23 with respect to the projection optical system PL. The trap surface 70 is inclined with respect to the XY plane, and is inclined to make separation from the surface of the substrate P (to be directed upwardly) at outer positions with respect to the projection area AR1 (liquid immersion area AR2). Lyophilic treatment (liquid-attracting treatment) is implemented on the trap surface 70. The film (resist, reflection prevention film, etc.) that is coated on the surface of the substrate P is normally water-repellent, so the liquid 1 that flows to the outside of the recovery port 23 is captured by the trap surface 70 and is ultimately recovered by the recovery port 23. Note that the liquid 1 in this embodiment is water that has a large polarity, so it is possible to give hydrophilic properties to the trap surface 70 by forming a thin film using a substance with a molecular structure that has a large polarity, such as alcohol, for example as the lyophilic treatment (hydrophilic treatment) for the trap surface 70.

Specifically, in the case where water is used as the liquid 1, treatment in which a substance with a molecular structure that has a large polarity, such as an OH group, is arranged on the trap surface 70 is preferable.

Figure 2:
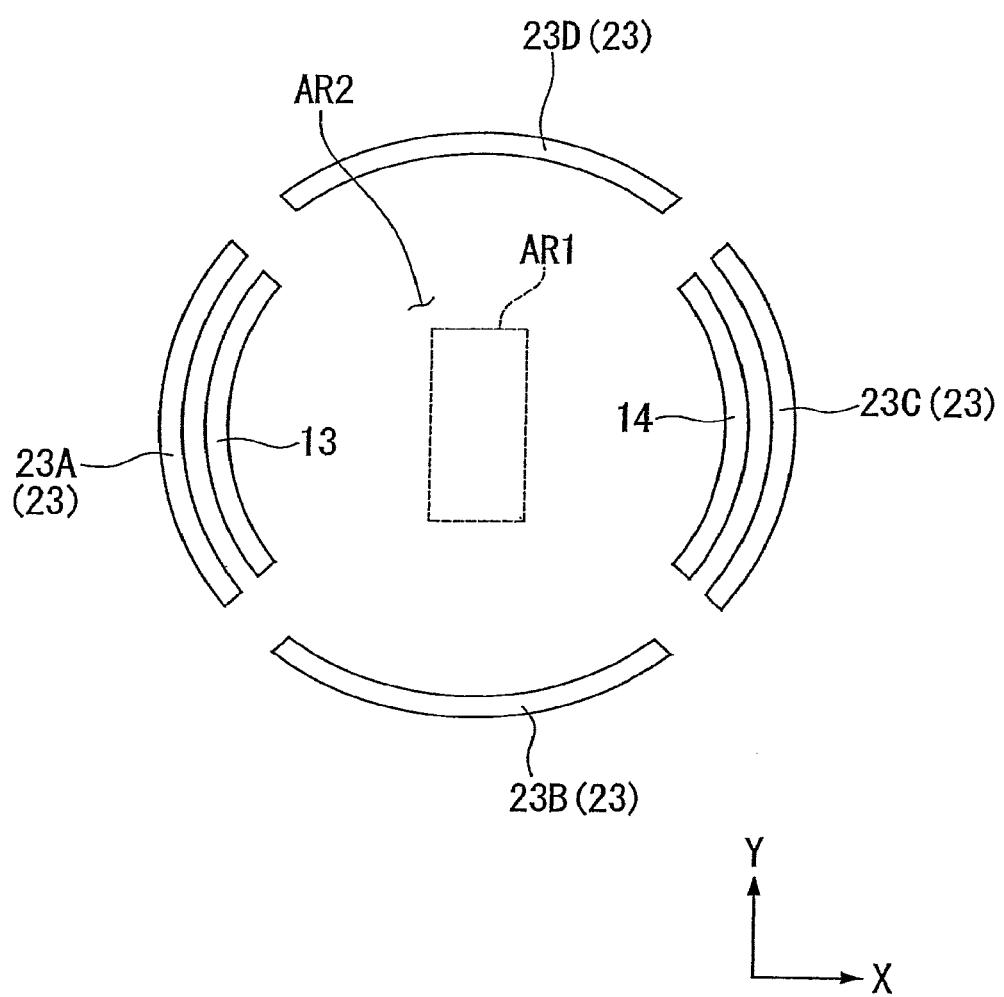
FIG. 2 is a plan view for describing the arrangement of the liquid supply port and the recovery port.

FIG. 2 is a plan view that shows the positional relationship between the projection region AR1 of the projection optical system PL and the first and second supply ports 13, 14 and first through fourth recovery ports 23A to 23D formed on the channel formation member 30.

In FIG. 2, the projection region AR1 of the projection optical system PL is set to a rectangular shape with the Y axis direction (the non-scanning direction) as the lengthwise direction, and a liquid immersion region AR2 that has been filled with liquid 1 is within a region including the projection region AR1 surrounded effectively by four recovery ports, and it is formed on a portion of the substrate P. The first supply port 13 is provided at one side (−X side) of the scanning direction with respect to the projection region AR1, and the second supply port 14 is provided on the other side (+X side). That is, the first and second recovery ports 13, 14 are arranged on both sides of the projection region AR1 in relation to the scanning direction (X direction) so as to interpose it. The respective first and second supply ports 13, 14 are formed as slits that are approximately arc-shaped in a planar view and that have specified lengths. The lengths in the Y axis direction of the first and second supply ports 13, 14 is at least longer than the length of the projection region AR1 in the Y axis direction. The liquid supply mechanism 10 is able to simultaneously supply liquid 1 on both sides of the projection region AR1 using the first and second supply ports 13, 14.

The first through fourth recovery ports 23A to 23D are arranged to surround the supply ports 13, 14 and projection region AR1. Of the plurality (four) of recovery ports 23A to 23D, the first recovery port 23A and the third recovery port 23C are arranged on both sides of the projection region AR1 in relation to the X axis direction to interpose it, and the second recovery port 23B and the fourth recovery port 23D are arranged on both sides of the projection region AR1 in relation to the Y axis direction to interpose it. The supply ports 13, 14 have a configuration in which they are arranged between the projection region AR1 and recovery ports 23A and 23C. The respective recovery ports 23A to 23D are formed in a slit shape that has a prescribed length and is approximately arc-shaped in a planar view. The length of recovery ports 23A and 23C in the Y axis direction is longer than the length of the supply ports 13, 14 in the Y axis direction. The respective recovery ports 23B and 23D are also formed to be nearly the same length as recovery ports 23A and 23C. The first through fourth recovery ports 23A to 23D are connected to the liquid recovery portion 21 via the first through fourth recovery tubes 22A to 22D respectively.

Note that, in this embodiment, the plurality of respective recovery ports 23A to 23D are formed to be nearly the same size (length), but they may also be mutually different sizes. In addition, the number of recovery ports 23 is not limited to four, and they may be plurally provided in any number as long as they are arranged to surround the projection region AR1 and the supply ports 13, 14.

Figure 3:
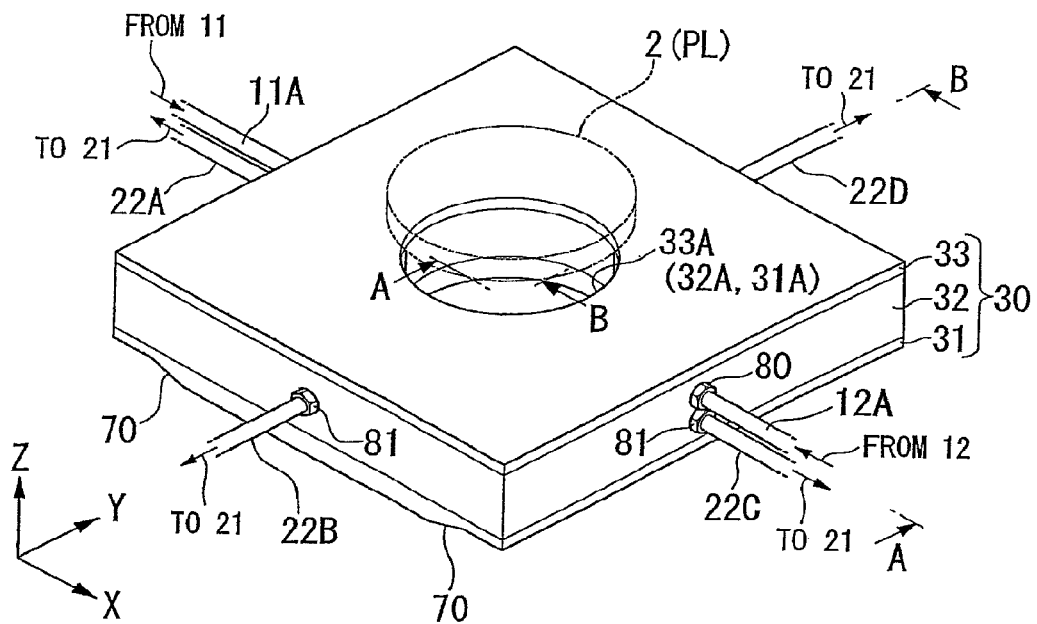
FIG. 3 is an oblique view that shows the channel formation member that constitutes the liquid supply mechanism and the liquid recovery mechanism.

FIG. 3 is a schematic oblique view of the channel formation member 30.

As shown in FIG. 3, the channel formation member 30 is a ring-shaped member provided to enclose the optical element 2 of the tip portion of the projection optical system PL, and it is provided with a first member 31, a second member 32 that is arranged on the upper portion of the first member 31, and a third member 33 that is arranged on the upper portion of the second member 32. The respective first through third members 31 to 33 that constitute the channel formation member 30 are plate-shaped members and have respective hole portions 31A to 33A that are able to arrange the projection optical system PL (optical element 2) at the center portion thereof. One end portion of first and second supply tubes 11A and 12A is connected to first and second liquid supply portions 11 and 12 respectively, and the other end portion is connected to the supply channel 82 formed inside the channel formation member 30. One end portion of first through fourth recovery tubes 22A to 22D is connected to the liquid recovery portion 21, and the other end portion is connected to the recovery channel 84 formed inside the channel formation member 30.

Figure 4:
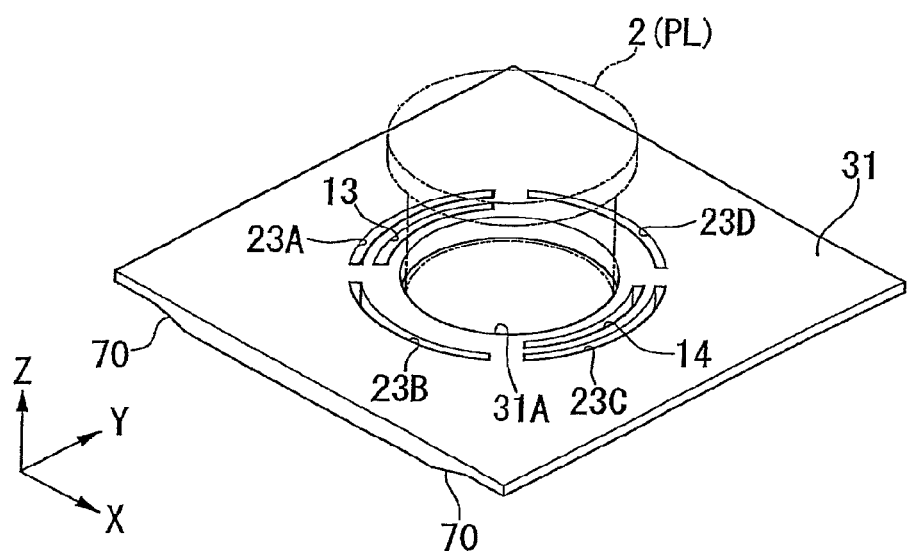
FIG. 4 is an oblique view that shows the first member of the channel formation member.

FIG. 4 is an oblique view that shows the first member 31 arranged at the lowest level among the first through third members.

The first member 31 is provided with a first supply port 13 that is formed on the −X side of the projection optical system PL and supplies liquid 1 to the substrate P and a second supply port 14 that is formed on the +X side of the projection optical system PL and supplies liquid onto the substrate P. The respective first supply port 13 and second supply port 14 are through holes that pass through the first member 31, and that are formed to be approximately arc-shaped in a planar view. In addition, the first member 31 is provided with a first recovery port 23A that is formed on the −X side of the projection optical system PL and recovers liquid on the substrate P, a second recovery port 23B that is formed on the −Y side of the projection optical system PL and recovers the liquid on the substrate P, a third recovery port 23C that is formed on the +X side of the projection optical system PL and recovers the liquid on the substrate P, and a fourth recovery port 23D that is formed on the +Y side of the projection optical system PL and recovers the liquid on the substrate P.

The respective first through fourth recovery ports 23A to 23D are also through holes that pass through the first member 31, formed to be approximately arc-shaped in a planar view, and provided at approximately equal intervals along the perimeter of the projection optical system PL. In addition the respective recovery ports 23A to 23D are provided further outside the projection optical system PL than the supply ports 13, 14. They are provided so that the separation distance of supply ports 13 and 14 with the substrate P and the separation distance of recovery ports 23A to 23D with the substrate P are nearly the same. Specifically, the height position of the supply ports 13, 14 and the height position of the recovery ports 23A to 23D are set to be nearly the same.

Figure 5A:
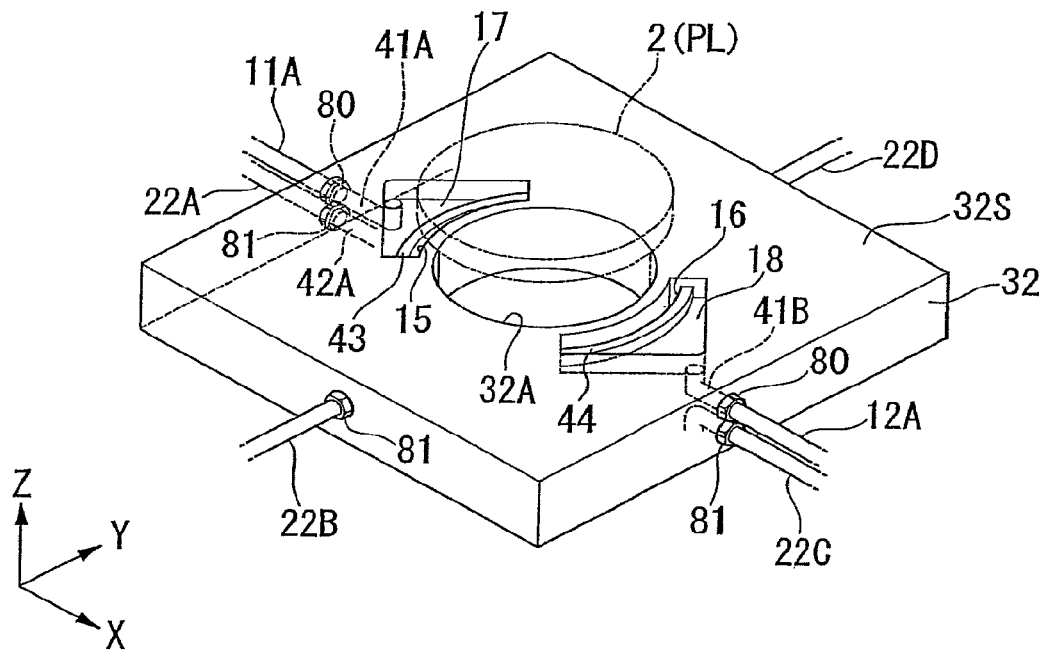
FIG. 5A and FIG. 5B are oblique views that show the second member of the channel formation member.
Figure 5B:
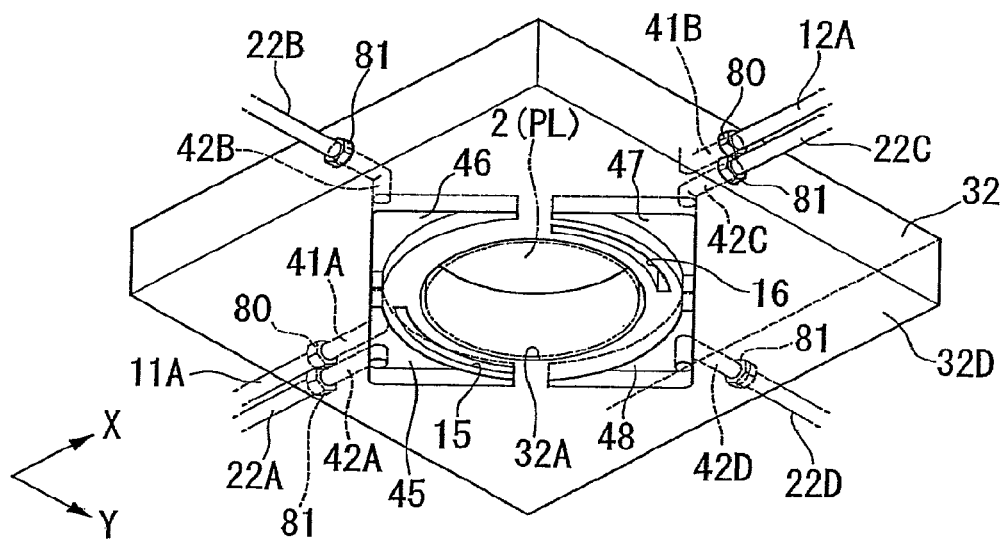

FIG. 5A and FIG. 5B are oblique views that show the second member 32 arranged at the middle level among the first through third members, where FIG. 5A is an oblique view as seen from the upper side, and FIG. 5B is an oblique view as seen from the lower side.

The other end portion of the first and second supply tubes 11A, 12A and the other end portion of the first through fourth recovery tubes 22A to 22D are connected to the second member 32 by means of couplers 80, 81. The second member 32 is provided with a first supply hole portion 15 that is formed on the −X side of the projection optical system PL and connects to the first supply port 13 of the first member 31 and a second supply hole portion 16 that is formed on the +X side of the projection optical system PL and connects to the second supply port 14 of the first member 31. The first and second supply hole portions 15, 16 are through holes, where the shape and size in a planar view correspond to the first and second supply ports 13, 14. Specifically, the first and second supply hole portions 15, 16 are slit-shaped channels that have an arc shape in a planar view.

In addition, a tapered groove portion 17 that is connected to the first supply portion 11A via a tube-shaped connection hole 41A is formed on the −X side of the projection optical system PL of the upper surface 32S of the second member 32. The tapered groove portion 17 is formed to gradually expand in the horizontal direction from the connection portion with the first supply tube 11A (connection hole 41A) toward the projection optical system PL side (first supply hole portion 15 side), and the length of the wide portion thereof in relation to the Y axis direction and the length of the first supply hole portion 15 are nearly the same. Also, a bank portion 43 is provided between the tapered groove portion 17 and the first supply hole portion 15. The bank portion 43 is a protrusion portion that is lower than the upper surface 32S of the second member 32 and higher than the tapered groove portion 17, and the length thereof in the Y axis direction is nearly the same as the length of the first supply hole portion 15 (first supply port 13). In the same way, a tapered groove portion 18 that connects with the second supply tube 12A via a connection hole 41B is formed on the +X side of the projection optical system PL of the upper surface of the second member 32. The tapered groove portion 18 is formed to gradually expand in the horizontal direction from the connection portion with the second supply tube 12A (connection hole 41B) toward the projection optical system PL side (second supply hole portion 16 side), and the length in the Y axis direction of the wide portion thereof is nearly the same as the length of the second supply hole portion 16. Also, a bank portion 44 is provided between tapered groove portion 18 and the second supply hole portion 16. The bank portion 44 is a protrusion portion that is lower than the upper surface 32S of the second member 32 and higher than tapered groove portion 18, and the length thereof in the Y axis direction is nearly the same as the length of the second supply hole portion 16 (second supply port 14). By connecting the first member 31 and the second member 32, the first and second supply holes 13, 14 formed on the first member 31 and the first and second supply hole portions 15, 16 formed on the second member 32 are respectively connected.

A tapered groove portion 45 that is connected to the first recovery portion 22A via a tube-shaped connection hole 42A is formed on the −X side of the projection optical system PL of the lower surface 32D of the second member 32. Tapered groove portion 45 is formed to gradually expand in the horizontal direction from the connection portion with the first recovery tube 22A toward the projection optical system PL side, and the length of the wide portion thereof in relation to the Y axis direction and the length of the first recovery port 23A of the first member 31 are nearly the same. Also, when the first member 31 and the second member 32 are connected, the wide portion of tapered groove portion 45 and the first recovery port 23A are connected. A tapered groove portion 46 that connects with the second recovery tube 22B via a connection hole 42B is formed on the −Y side of the projection optical system PL, and it is formed to gradually expand in the horizontal direction from the connection portion with the second recovery tube 22B toward the projection optical system PL side. In addition, it is such that the wide portion of tapered groove portion 46 is connected with the second recovery port 23B of the first member 31. In the same way, tapered groove portions 47 and 48 that connect with third and fourth recovery tubes 22C and 22D via connection holes 42C and 42D are respectively formed on the +X side and the +Y side of the projection optical system PL, and they are formed to gradually expand in the horizontal direction from the connection portion with the third and fourth recovery tubes 22C, 22D toward the projection optical system PL side. In addition, they are such that the wide portion of the tapered groove portions 47, 48 and the third and fourth recovery ports 23C, 23D of the first member 31 are connected.

Figure 6:
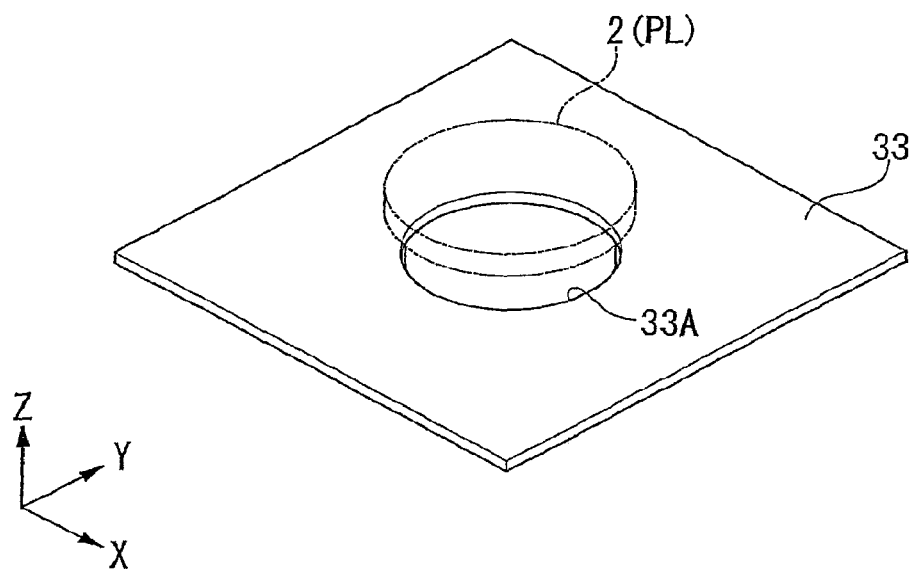
FIG. 6 is an oblique view that shows the third member of the channel formation member.

FIG. 6 is a drawing that shows the third member 33.

The lower surface of the third member 33 is a flat surface. When the second member 32 and the third member 33 are connected, the upper surface 32S of the second member 32 and the lower surface of the third member 33 come into contact. The bank portions 43, 44 are lower than the upper surface 32S, so they do not come into contact with the lower surface of the third member 33.

Note that, in this embodiment, the channel formation member 30 is formed using three members, but the number of members is not limited thereto. In addition, the channel to the supply ports 13, 14 and the channel to the recovery ports 23A, 23B, 23C, 23D may be selectively formed on each of the respective members, and channels may be formed on separate members for each port.

Figure 7:
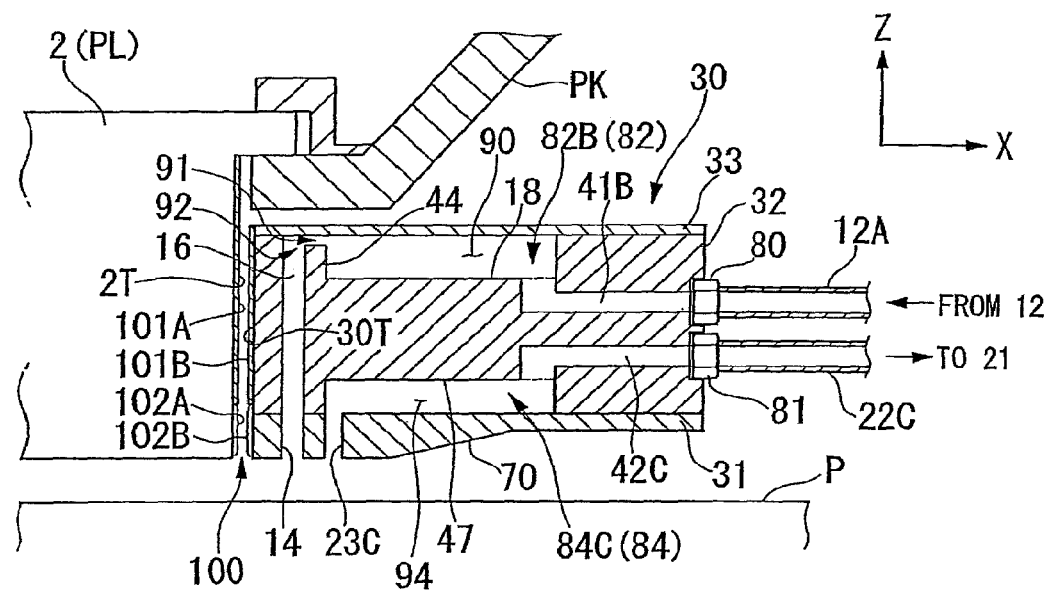
FIG. 7 is an A-A cross-sectional view of FIG. 3, and it is a drawing that shows the liquid supply channel and the recovery channel.
Figure 8:
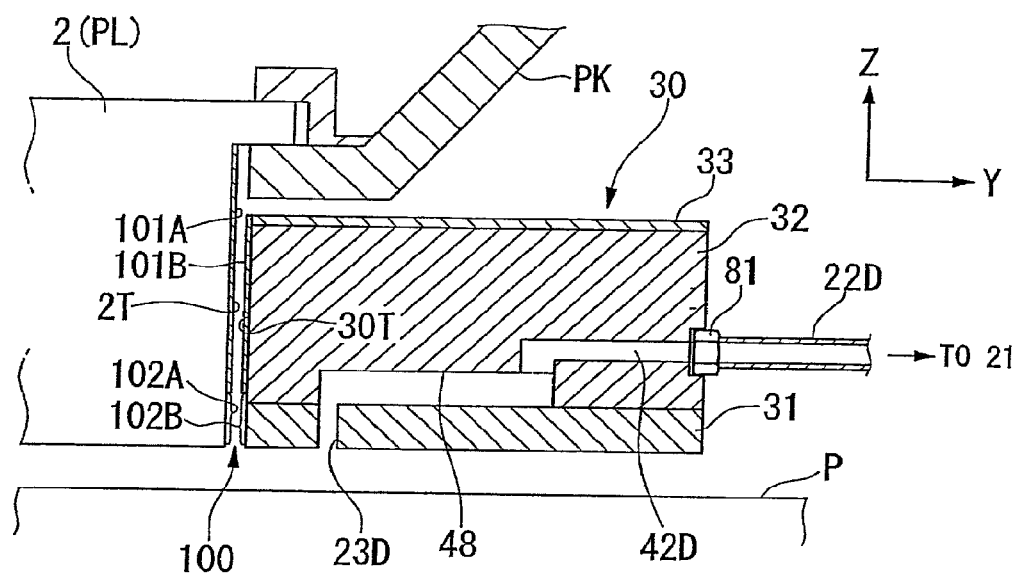
FIG. 8 is a B-B cross-sectional view of FIG. 3, and it is a drawing that shows the liquid recovery channel.

FIG. 7 is a cross-sectional diagram at the A-A arrow of FIG. 3, and FIG. 8 is a cross-sectional diagram at the B-B arrow of FIG. 3.

Note that, the following explanation is with respect to the supply channel 82B (82) and the circuit channel 84C (84) provided on the +X side of the projection optical system PL of the channel formation member 30, but the supply channel 82A provided on the −X side of the projection optical system PL, the recovery channel 82A of the −X side of the projection optical system PL, the recovery channel 82B of the −Y side and the recovery channel 82D of the +Y side also have an equivalent configuration.

In FIG. 7, the supply channel 82B is provided with a connection hole 41B in which one end portion thereof connects to the supply tube 12A via a coupler 80, and the other end portion is connected to tapered groove portion 18, a buffer space portion 90 formed between the tapered groove portion 18 and the third member 33, a narrow channel portion 91 formed between the bank portion 44 and the third member 33 and that is narrower than the buffer space portion 90, and a supply hole portion 16 whose top end portion connects to the narrow channel portion 91 and whose lower end portion connects to supply port 14. The buffer space portion 90 forms a relatively wide channel. In the buffer space portion 90 and the narrow channel portion 91, the liquid 1 flows in a nearly horizontal direction (XY plane direction), and, in the supply hole portion 16, the liquid 1 flows in a nearly vertical direction (−Z direction). Specifically, the supply channel 82B has a corner portion 92 on its path, and the narrow channel portion 91 has a configuration in which it is provided in the vicinity of (immediately before) that corner portion 92.

The narrow channel portion 91 is provided further on the channel downstream side than the buffer space portion 90. Specifically, the narrow channel portion 91 in the vicinity of the corner portion 92 has a configuration that is narrower than the buffer space portion 90, which is the channel in front thereof. In this embodiment, the narrow channel portion 91 is formed between the bank portion 44 that protruded upward from the second member 32 and the third member 33 and is narrowed in the vertical direction with respect to the buffer space portion 90.

The liquid 1 that is sent from the liquid supply portion 12 flows to the connection hole 41B of the supply channel 82B via a supply tube 12A. After the liquid 1 flows through the buffer space portion 90 in a nearly the horizontal direction and flows through the narrow channel portion 91, it changes direction to the substrate P side at the corner portion 92, and it is supplied onto the substrate P from supply port 14 via a supply hole portion 16.

On the other hand, a recovery channel 84C has a buffer space portion 94, one end portion of which is connected to a recovery port 23C and the other end portion of which is connected to a connection hole 42C. Through the driving of the liquid recovery portion 21 that has a vacuum pump, the liquid 1 on the substrate P flows upward in the vertical direction (+Z direction) to the recovery channel 84C via recovery port 23C. At this time, along with the liquid 1 on the substrate P, gas (air) in the vicinity thereof also flows (is recovered) from recovery port 23C. The direction of the liquid 1 that has flowed into the recovery channel 84C is changed to the horizontal direction on the side of the one end portion of the buffer space portion 94, and it flows through the buffer space portion 94 in a nearly horizontal direction. After that, it flows through the connection hole 42C and is sent to the liquid recovery portion 21 via a recovery tube 22C.

The first through third members 31 to 33 are formed of a metal such as stainless steel, titanium, aluminum or an alloy that contains these, and the hole portion and the groove portion of the respective members 31 to 33 are formed by discharge processing, for example. After the process for the respective members 31 to 33 by discharge processing, a channel formation member 30 is formed by joining these respective members 31 to 33 using a bonding agent, a joint member or the like. Note that the liquid contact surface of the first through third members 31 to 33 may have electrolytic polishing or non-conductor oxidation film treatment or both implemented. By joining the respective members 31 to 33, a supply channel 82B (82), which includes a buffer space portion 90 and a narrow channel portion 91, and a recovery channel 84C (84), which includes a buffer space portion 94, are formed. Note that the respective members constituting a liquid supply mechanism 10 and liquid recovery mechanism 20 including the channel formation member 30 may be formed by a synthetic resin such as polytetrafluorethylene.

A minute gap 100 is formed between the inner side surface 30T of the channel formation member 30, which constitutes a portion of the liquid supply mechanism 10 and the liquid recovery mechanism 20, and the side surface 2T of the optical element 2 of the terminating end portion, which comes into contact with the liquid 1, of the projection optical system PL. The minute gap 100 is provided to vibrationally separate the optical element 2 of the projection optical system PL and the channel formation member 30, and, with the aid of the minute gap 100, the vibration generated in the liquid supply mechanism 10 and the liquid recovery mechanism 20 can be prevented from being transmitted to the projection optical system PL. The minute gap 100 is formed small enough to cause a liquid 1 permeation phenomenon in order to bring the projection region AR1 and the supply port 14 as close together as possible, and the minute gap 100 is connected with the gas space in the vicinity of the channel formation member 30. The liquid supply mechanism 10 and the liquid recovery mechanism 20 that include the channel formation member 30 are respectively supported by a support members other than the projection optical system PL and the support members that support this projection optical system PL.

Liquid repellence (water repellence) treatment is performed on both the inner side surface 30T of the channel formation member 30 and the side surface 2T of the optical member 2, which form the minute gap 100. The liquid repellence treatment portions 101A, 101B where the liquid repellence treatment is performed are provided at a portion that is separated from the lower end portion of the minute gap 100 that comes into contact with the liquid 1. The size (distance in the Z axis direction) of the non-liquid repellence treatment portions 102A, 102B between the lower end portion of the minute gap 100 and the liquid repellence treatment portions 101A, 101B of the inner side surface 30T of the channel formation member 30 and the side surface 2T of the optical element 2 is set to be nearly the same as the distance (so-called working distance) between the projection optical system PL and the substrate P, for example. Note that, in the example shown in FIG. 7 and FIG. 8, liquid repellence treatment portion 101A is provided on nearly the entire surface of the side surface 2T of the optical element 2 with the exception of the vicinity of the lower end portion of the minute gap 100, but it may also be a configuration in which the portion 101A is provided on a portion thereof, and it may be a configuration in which the portion 101A is provided discontinuously (in an island shape). Similarly, instead of a configuration in which liquid repellence treatment portion 101B is provided on nearly the entire surface of the inner side surface 30T of the channel formation member 30 with the exception of the vicinity of the lower end portion of the minute gap 100, there may also be a configuration in which it is provided on a portion thereof.

An example of liquid repellence treatment is a coating treatment using a material that has liquid repellent properties. Examples of materials that have liquid repellent properties are a fluorocarbon compound, a silicon compound or a synthetic resin such as polyethylene. In addition, the thin film for surface treatment may be a single layer film, and it may also be a film consisting of a plurality of layers.

Note that the liquid 1 contact angle at the liquid repellent surface of the inner side surface 30T of the channel formation member 30 and the side surface 2T of the optical element 2 is 70 degrees or more, and preferably 90 degrees or more.

Figure 9:
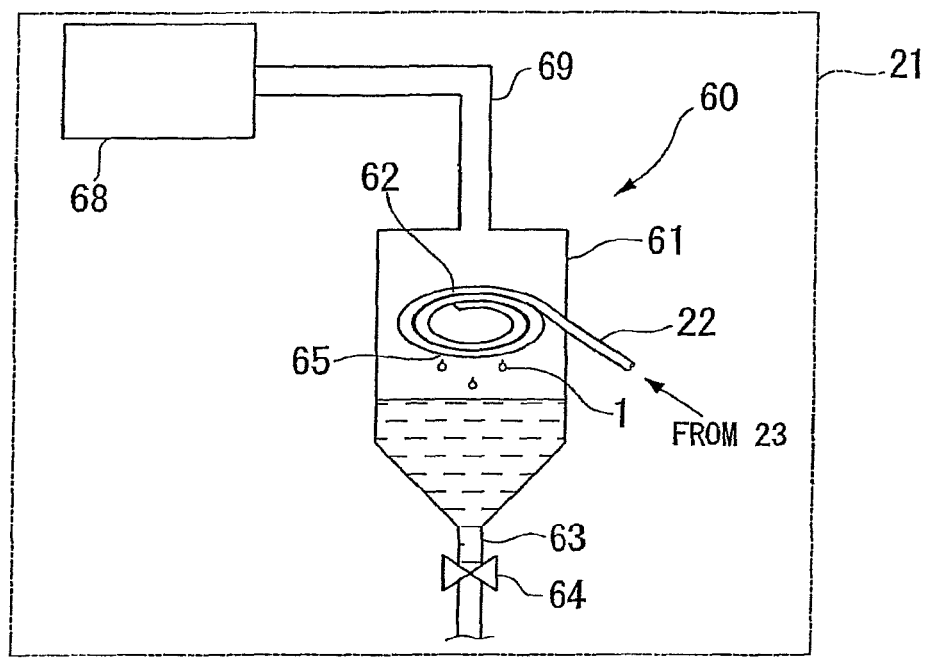
FIG. 9 is a schematic block diagram that shows the gas-liquid separator.

FIG. 9 is a principal parts enlarged drawing of the liquid recovery portion 21.

Provided on the liquid recovery portion 21 are a gas-liquid separator 60 connected to recovery tube 22 and a vacuum system 68 that is connected to that gas-liquid separator 60 via a discharge tube 69 and that has a mass flow controller, a vacuum pump, and the like. Here, as described above, in addition to the liquid 1 on the substrate P, the surrounding gas is also recovered from recovery port 23. The gas-liquid separator 60 separates the liquid and gas recovered from recovery port 23. The gas-liquid separator 60 is provided with a tank 61 and a separation tube 62 that is provided inside the tank 61 and connects with recovery tube 22. The upper part of the tank 61 is connected to the vacuum system 68, and a discharge tube portion 63 is provided on the lower portion of the tank 61. A valve 64 that opens and closes the channel of the discharge tube portion 63 is provided on this discharge tube portion 63.

Note that the separator 60 may be provided on the plurality of the respective first through fourth recovery tubes 22A to 22D, or, it may be a configuration in which the plurality of the first through fourth recovery tubes 22A to 22D are assembled, the separator 60 is provided on this assembled tube.

Figure 10:
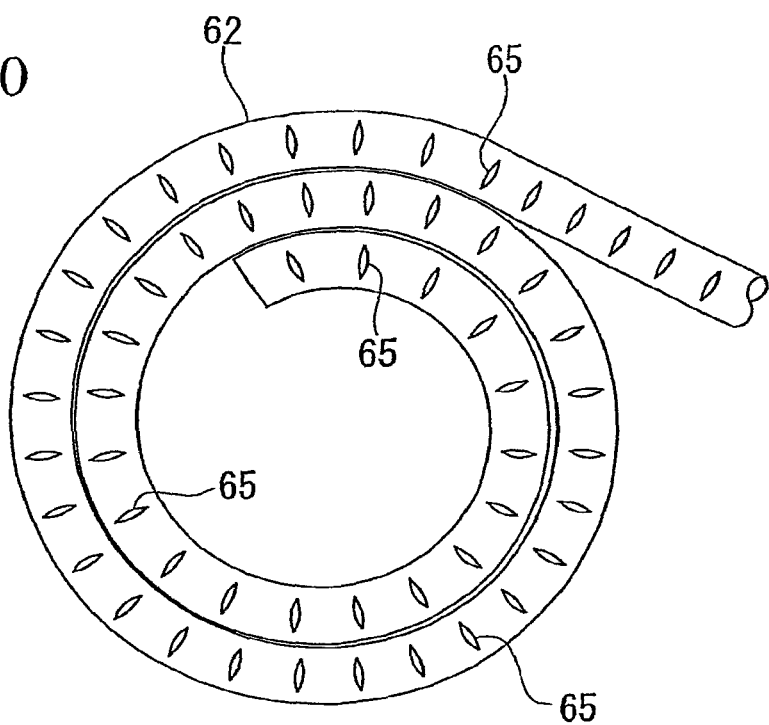
FIG. 10 is a drawing that shows the separation tube of the gas-liquid separator.

FIG. 10 is an enlarged drawing of the separator tube 62 as seen from the bottom.

As shown in FIG. 10, the separator tube 62 is bent in a vortex shape (spiral shape), and a plurality of slit-shaped hole portions 65 are formed at prescribed intervals on the lower surface thereof. Therefore, when the vacuum system 68 is driven, a negative pressure is applied to the tank 61 and the recovery tube 22, and the liquid 1 on the substrate P is recovered along with the gas in the vicinity thereof via recovery port 23. The liquid and gas recovered from recovery port 23 flow into the separator tube 62 provided within the tank 61 via the recovery tube 22. By flowing through the separator tube 62, the liquid 1 drops via the hole portion 65 due to gravitational action and is collected in the lower portion of the tank 61. Note that by operating valve 64 to open the discharge tube portion 63, the liquid 1 that has collected in the tank 61 can be discharged to the outside. On the other hand, the gas is sucked in by a vacuum system 68 via the discharge tube 69 connected to the upper portion of the tank 61. In this way, by separating the liquid and the gas recovered by means of the gas-liquid separator 60, liquid 1 does not flow into the vacuum system 68 that has a vacuum pump, etc., so it is possible to prevent inconvenience such as the malfunction of that vacuum pump. Note that the vacuum system of the plant in which the exposure apparatus EX is installed may be used without providing a vacuum pump on the vacuum system 68.

Next, a method in which the aforementioned exposure apparatus EX is used to expose the image of the pattern on the mask M onto the substrate P will be explained.

Here, the exposure apparatus EX in this embodiment projection-exposes the pattern image of the mask M on the substrate P while moving the mask M and the substrate P in the X axis direction (scanning direction). During scanning exposure, the pattern image of a portion of the mask M is projected onto the rectangular projection region AR1 under the tip portion of the projection optical system PL, and in synchronization with the mask M moving in the −X direction (or the +X direction) at a velocity V with respect to the projection optical system PL, the substrate P moves in the +X direction (or the −X direction) at a velocity β·V (where β is the projection magnification) by means of the XY stage 53. A plurality of shot regions are set on the substrate, and after exposure to one shot region has been completed, the next shot region moves to the scanning start position by means of the stepping movement of the substrate P. Thereafter the scanning exposure process for the respective shot regions is sequentially performed while moving the substrate P by a step and scan system.

When the scanning exposure process is performed, the control apparatus CONT drives the liquid supply mechanism 10 and starts the operation of liquid supply onto the substrate P. The liquid 1 that is respectively sent from the first and second liquid supply portions 11, 12 of the liquid supply mechanism 10 is supplied onto the substrate P via supply channels 82A, 82B formed within the channel formation member 30 after flowing through the supply tubes 11A, 12A.

For example, the liquid 1 sent from the second liquid supply portion 12 expands, after flowing through the second supply tube 12A, in the horizontal direction (Y axis direction) by flowing through the buffer space portion 90 formed so that it gradually widens in the horizontal direction. Here, because the bank portion 44 is formed on the channel downstream side of the buffer space portion 90, the liquid 1 that has been sent from the second liquid supply portion 12 is reserved for a time in the buffer space portion 90. The liquid 1 flows to the supply hole portion 16 via the narrow channel portion 91 after a prescribed amount or more has reserved in the buffer space portion 90 (after the level of the liquid 1 has reached at least the height of the bank portion 44). In this way the supply of liquid 1 to supply port 14 is started. Through this, the liquid 1 that has flowed out from the buffer space portion 90 is supplied nearly uniformly onto the substrate P from the slit-shaped supply port 14, which has the Y axis direction as the lengthwise direction. That is, if the narrow channel 91 (the bank portion 44) is not formed, the flow volume of the liquid 1 that has flowed through tapered groove portion 18 would be such that the center portion of the width direction of tapered groove portion 18 is larger than that of the end portion, so there would be cases in which the liquid supply volume going onto the substrate P becomes non-uniform at the respective positions of the supply port 14, which has the Y axis direction as the lengthwise direction. However, by providing the narrow channel 91 so that the supply of liquid to the supply port 14 starts after the prescribed volume or more of liquid 1 is reserved, the liquid 1 is supplied onto the substrate P at a nearly uniform liquid supply volume at the respective positions of the approximately arc-shaped supply port 14, which has the Y axis direction as the lengthwise direction. Similarly, the supply of the liquid 1 that has been sent out from the first liquid supply portion 11 to the supply port 13 is also started after a prescribed amount or more has reserved in the buffer space portion 90, so it is supplied nearly uniformly onto the substrate P from the slit-shaped supply port 13. In addition, even after the start of the supply from the supply ports 13, 14, the liquid 1 continues to flow to the supply ports 13, 14 via the buffer space portion 90, so it is possible to continue the supply of liquid onto the substrate P at a uniform volume at the respective positions of the supply ports 13, 14.

Here, bubbles tend to remain, for example, at the start of supply, in the vicinity of the corner portion 92 of the supply channel 82B (82A), but by narrowing the supply channel 82B in the vicinity of this corner portion 92, the liquid 1 that flows through the narrow flow portion 91 can be made to flow at a high rate, and the bubbles can be discharged to outside the supply channel 82B via supply port 14 by means of this liquid 1 that has been made to flow at high rate. Then, by implementing the liquid immersion exposure operation after the bubbles have been discharged, exposure processing can be performed in a status in which there are no bubbles in the liquid immersion region AR2.

In this embodiment, the liquid mechanism 10 simultaneously performs supply of liquid 1 onto the substrate P from both sides of the projection region AR1 from the supply ports 13, 14. Through this, the liquid 1 that is supplied onto the substrate P from the supply ports 13, 14 expands to wet well between the substrate P and the lower end surface of the optical element 2 of the terminating end portion of the projection optical system PL, and the liquid immersion region AR2 is formed in a range that is at least wider than the projection region AR1.

In addition, the control apparatus CONT drives the liquid recovery portion 21 of the liquid recovery mechanism 20 and performs the recovery operation of the liquid on the substrate P in parallel with the supply operation of the liquid 1 by the liquid supply mechanism 10. Through this, the liquid 1 on the substrate P that flows to the outside with respect to the projection region AR1 from the supply ports 13, 14 is recovered from the recovery ports 23A to 23D. Since a portion of the recovery channel 84 (84A to 84D) is also buffer space portion 94 in which an end portion thereof has nearly the same length as the Y axis direction of the recovery port (23A to 23D) and which is formed in a tapered manner that gradually becomes smaller toward recovery tube 22, it is possible to recover the liquid 1 on the substrate P at a nearly uniform liquid recovery volume at the respective positions of recovery port 23.

While the control apparatus CONT performs the recovery of the liquid 1 on the substrate P in parallel with the supply of liquid 1 to the surface of the substrate P by means of the liquid supply mechanism 10 and the liquid recovery mechanism 20 as it moves the substrate stage PST that supports the substrate P in the X axis direction (scanning direction), it projection-exposes the pattern image of the mask M onto the substrate P via the projection optical system PL and the liquid 1 between the projection optical system PL and the substrate P.

At this time, the liquid supply mechanism 10 simultaneously performs the supply of the liquid 1 from both sides of the projection region AR1 in relation to the scanning direction via the supply ports 13, 14, so the liquid immersion region AR2 is formed uniformly and well. In addition, the liquid recovery mechanism 20 simultaneously performs the recovery of the liquid 1 at a plurality of positions in the surrounding area of the projection region AR1 including both sides of the scanning direction of the projection region AR1 via the plurality of recovery ports 23A to 23D that surround the projection region AR1, so it prevents scattering and outflow of the liquid 1 to the surroundings of the substrate P.

Note that, in this embodiment, when liquid 1 is supplied to the substrate P from both sides of the scanning direction of the projection region AR1, the control apparatus CONT controls the liquid supply operation of the first and second liquid supply portions 11, 12 of the liquid supply mechanism 10 so that, in relation to the scanning direction, the supply volume per unit time supplied from in front of the projection region AR1 is higher than the supply volume of liquid supplied at the opposite side thereof. For example, in the case where exposure processing is performed while moving the substrate P in the +X direction, the control apparatus CONT makes the liquid volume from the −X side (that is, from the supply port 13) larger than the liquid volume from the +X side (that is, from the supply port 14). On the other hand, in the case where exposure processing is performed while moving the substrate P in the −X direction, it makes the liquid volume from the +X side larger than the liquid volume from the −X side with respect to the projection region AR1. Here, there are cases in which, for example, due to the substrate P moving in the +X direction, the liquid volume that moves to the +X side with respect to the projection region AR1 increases, and the recovery port 23C, which is provided at a liquid recovery position on the +X side, cannot recover all of the liquid 1. In any case, the liquid 1 unsuccessfully recovered by the +X side recovery port 23C is captured at the trap surface 70 provided on the +X side of the liquid recovery position, so it does not flow out and is not dispersed around the substrate P, etc.

In addition, as described above, because the minute gap 100 is provided between the channel formation member 30 and the optical element 2, the inconvenience in which the vibration produced by the liquid supply mechanism 10 and the liquid recovery mechanism 20 is transmitted to the projection optical system PL is prevented. However, when this gap is too large, it leads to the entire apparatus becoming larger. In addition, since the supply ports and the recovery ports of the liquid 1 are provided at positions that are away from the projection region AR1, there is a possibility that the liquid immersion region AR2 will not be formed well so that it includes the projection region AR1, and the inconvenience of an increase in the amount of liquid used also occurs. Also, due to that large gap, there is a possibility that mixing in of gas (bubbles) to the liquid immersion region AR2 will occur. Therefore, in this embodiment, the minute gap 100 is provided at a size at which the phenomenon of penetration or permeation of the liquid 1 will be caused. Through this, while it is possible to prevent the apparatus from becoming larger, it is also possible to prevent the inconvenience whereby gas gets into the liquid immersion region AR2 from the gap. On the other hand, in the case where liquid 1 has penetrated into the minute gap 100, the penetrated liquid 1 goes into a stagnant status, so the degree of cleanliness drops, and there is a possibility of the occurrence of the inconvenience whereby that liquid 1 of the minute gap 100, whose degree of cleanliness has dropped, becomes mixed into the liquid immersion region AR2 during liquid immersion exposure, for example. Therefore, the penetration of the liquid 1 to the minute gap 100 can be prevented by respectively performing water repellence treatment on the inner side surface 30T of the channel formation member 30 and the side surface 2T of the optical element 2 that form the minute gap 100.

Figure 11:
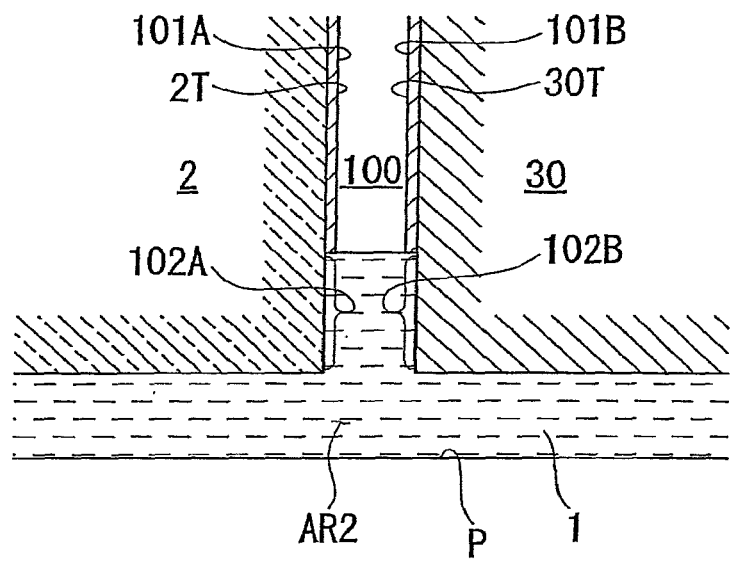
FIG. 11 is an enlarged view of the vicinity of the minute gap.

FIG. 11 is an enlarged drawing of the minute gap 100.

Figure 12:
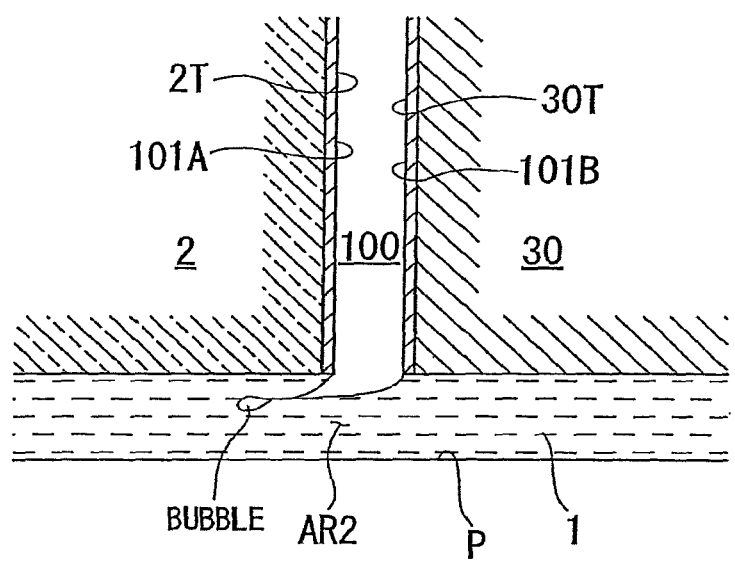
FIG. 12 is an enlarged view that shows another example of the vicinity of the minute gap.

As shown in FIG. 11, since water repellence treatment is performed on the inner side surface 30T of the channel formation member 30 and the side surface 2T of the optical element 2, the rising phenomenon of the liquid 1 of the liquid immersion region AR2 does not occur, and the liquid 1 of the liquid immersion region AR2 does not get into the space between the liquid repellence treatment portions 101A, 101B. On the other hand, due to the permeation phenomenon, the liquid 1 gets into the space between the non-liquid repellence treatment portions 102A, 102B of the minute gap 100. Due to this liquid 1 that has gotten into the space, the inconvenience whereby gas that is present between the water repellence treatment portions 101A, 101B becomes mixed into the liquid immersion region AR2 is restricted. Specifically, as shown in FIG. 12, in the case where water repellence treatment is performed up to the lower end portions of the inner side surface 30T of the channel formation member 30 and the side surface 2T of the optical element 2 that form the minute gap 100, gas (air) is filled up to the lower end portion of the minute gap 100, and there is a possibility of the occurrence of the inconvenience whereby the gas (bubbles) of the minute gap 100 gets into the liquid immersion region AR2 during liquid immersion scanning exposure. Therefore, on the point of prevention of the penetration of liquid 1 to the minute gap 100, as shown in FIG. 12, liquid repellence treatment may be performed up to the lower end portion, but, as in this embodiment, by making the non-liquid repellence treatment portions 102A, 102B in the prescribed ranges of the vicinity of the lower end portion of the minute gap 100 which comes into contact with the liquid 1 of the liquid immersion region AR2 and making it possible to arrange the liquid 1 in the vicinity of the lower end portion of the minute gap 100 with the aid of the permeation phenomenon, it is possible to prevent the inconvenience whereby the gas that is present in the minute gap 100 gets into the liquid immersion region AR2. Note that, in FIG. 11, the amount of liquid 1 that has gotten into the space between the non-liquid repellence treatment portions 102A, 102B is slight, and stagnation does not occur, so liquid 1 with low degree of cleanliness is not mixed into the liquid immersion region AR2 during liquid immersion exposure.

Note that, in this embodiment, water repellence treatment is performed on both the inner side surface 30T of the channel formation member 30 and the side surface 2T of the optical element 2 that form the minute gap 100, but performing water repellence treatment on at least either one of the surfaces will make it possible to avoid liquid 1 getting into the minute gap 100.

As explained above, by supplying the liquid 1 after reserving a prescribed amount or more in the buffer space portion 90, it is possible to make the flow amount distribution and/or flow rate distribution of the liquid 1 with respect to the supply ports 13, 14 even. Therefore, it is possible to evenly supply the liquid 1 from the supply ports 13, 14 onto the substrate P.

In addition, for apparatus space convenience, etc., in the case where it is necessary to form a corner portion 92 at one portion of the supply channel 82, bubbles tend to remain in the vicinity of this corner portion 92, but the flow rate of the liquid 1 can be accelerated by narrowing the channel in the vicinity of the corner portion 92, and the bubbles can be discharged to the exterior via the supply ports 13, 14 by means of this high speed flow of the liquid 1. Also, performing a liquid immersion exposure operation after the bubbles have been discharged makes it possible to prevent mixing of the bubbles from the supply channel 82 into the liquid immersion region AR2 and to perform exposure processing in a status in which bubbles are not present in the liquid immersion region AR2. Particularly, as in this embodiment, narrowing a portion of the supply channel 82 in the vertical direction by means of the bank portion 44 (43) makes it possible to increase the flow rate of the liquid 1, which has flowed through the buffer space portion 90 nearly horizontally, to strike that liquid 1 to the corner portion 92 and to remove sufficiently the bubbles in the vicinity of the corner portion 92.

Because the channel formation member 30 is a block-shaped member formed by combining the first through third members 31 to 33, which are plate-shaped members, the channel formation member 30 can absorb the vibration generated, for example, when the liquid 1 is sucked in with gas. Also, because a process such as discharge process was performed on each of the plurality of plate-shaped members 31 to 33 to form a portion of the channel, and the channel of the liquid 1 was formed by combining these members, it is possible to respectively form the supply channel 82 and the recovery channel 84 easily.

Note that, in this embodiment, the members 31 to 33 that form the channel formation member 30 are square plate-shaped members, but they may also be circular plate-shaped members, or they may be elliptical plate-shaped members which are long in the X axis direction.

Figure 13:
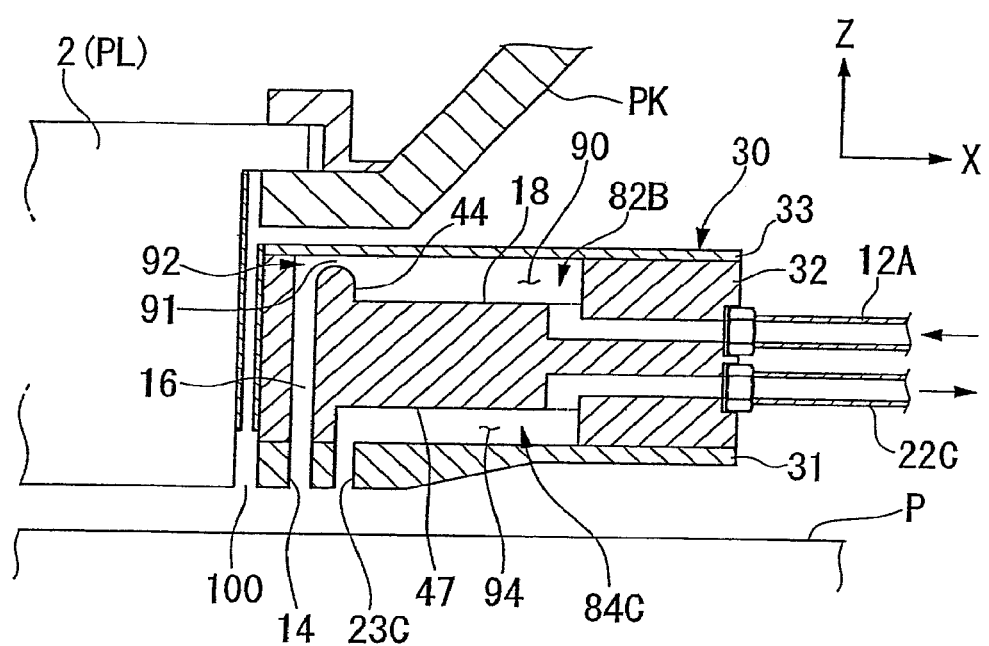
FIG. 13 is a drawing that shows another embodiment of the liquid supply channel and the recovery channel.
Figure 14:
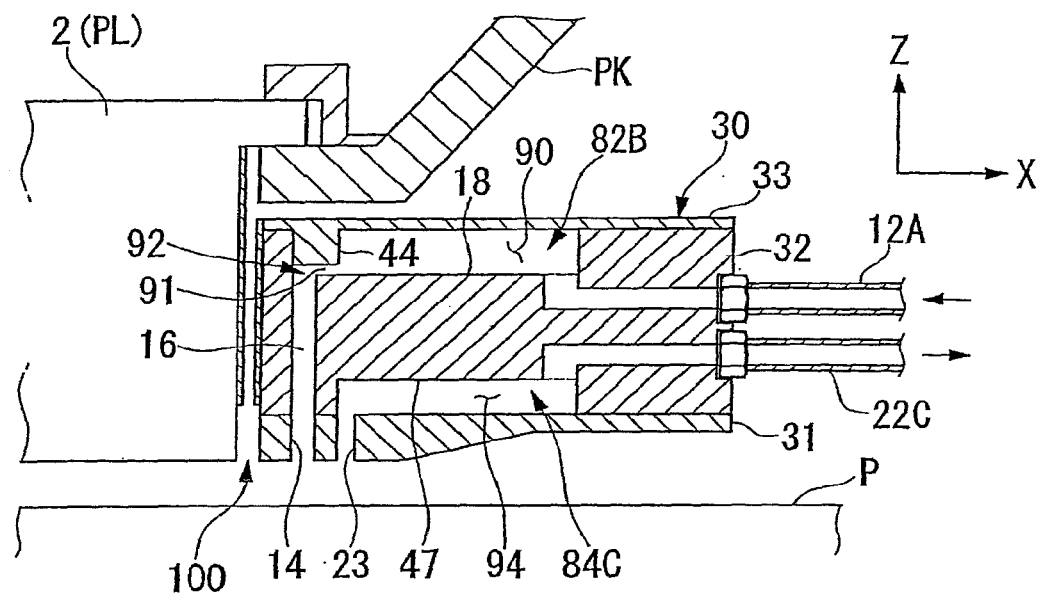
FIG. 14 is a drawing that shows another embodiment of the liquid supply channel and the recovery channel.

Note that, in this embodiment, the bank portion 44 (43) is rectangular in a cross-sectional view, but as shown in FIG. 13, it may be arc-shaped (curved surface-shaped) in a cross-sectional view. Or, it may be a polygonal shape such as one that is triangular or pentangular in a cross-sectional view. In addition, the effects of the buffer space portion become weaker, but, as shown in FIG. 14, the bank portion 44 may be provided on the lower surface of the third member 33, and the narrow channel portion 91 may be formed between that bank portion 44 and the tapered groove portion 18.

Figure 15:
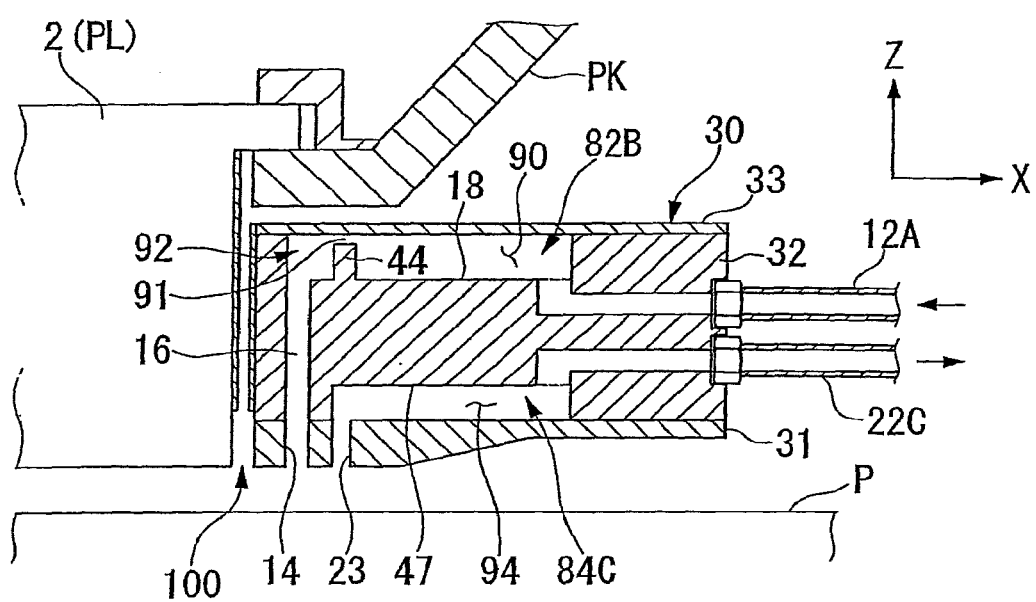
FIG. 15 is a drawing that shows another embodiment of the liquid supply channel and the recovery channel.

In this embodiment, the bank portion 44 is provided in the vicinity of the corner portion 92 of the supply channel 82, but, as shown in FIG. 15, it may be provided at a position that is slightly separated from the corner portion 92. In the example shown in FIG. 15, the bank portion 44 is provided on the channel upstream side from the corner portion 92. By doing this as well, it is possible to form a buffer space portion 90 on the upstream side of the channel of the bank portion 44, and it is possible to make the supply of liquid 1 from the supply port 14 (13) even. On the other hand, providing the bank portion 44 in the vicinity of the corner portion 92 is able to make the flow rate of the liquid 1 at the corner portion 92 high speed, so it is possible to prevent bubbles from remaining in the corner portion 92.

Figure 16:
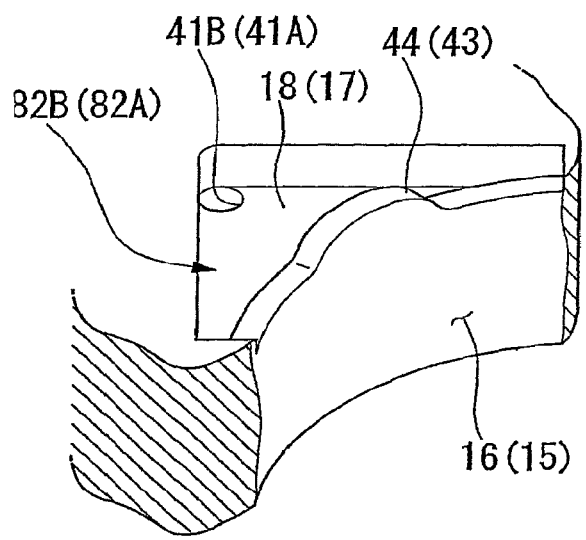
FIG. 16 is an oblique view that shows another example of the bank portion.

In this embodiment, the bank portion 44 (43) has a uniform height in the lengthwise direction thereof, but there may also be a height distribution as shown in FIG. 16. The bank portion 44 shown in FIG. 16 is such that the height of the center portion in the width direction thereof is higher than both end portions. In the tapered groove portion 18, the flow volume of the liquid 1 at the center portion of the width direction thereof is greater than the flow volume at the end portion. Accordingly, by raising the center portion of the bank portion 44 in the width direction and making the center portion of the narrow channel portion 91 in the width direction narrower than that of both ends, it is possible to supply liquid 1 more evenly onto the substrate P via the supply port 14.

Note that it is desirable that the bank portion 44 (43) be provided along the entire width direction of the supply channel 82, but it may also be provided on a portion thereof. Or it may also be a configuration in which a plurality of divided bank portions is discontinuously arranged (in island shapes). By doing this as well, the channel narrows, so it is possible to make the flow rate of the liquid 1 high speed, and it is possible to discharge the bubbles that are present in the supply channel 82 to the outside.

Note that the bank portion (narrow channel portion) may be formed in the recovery channel 84 that recovers the liquid 1 on the substrate P. Through this, it is possible to evenly recover the liquid 1 on the substrate P from the slit-shaped recovery port 23.

Figure 17:
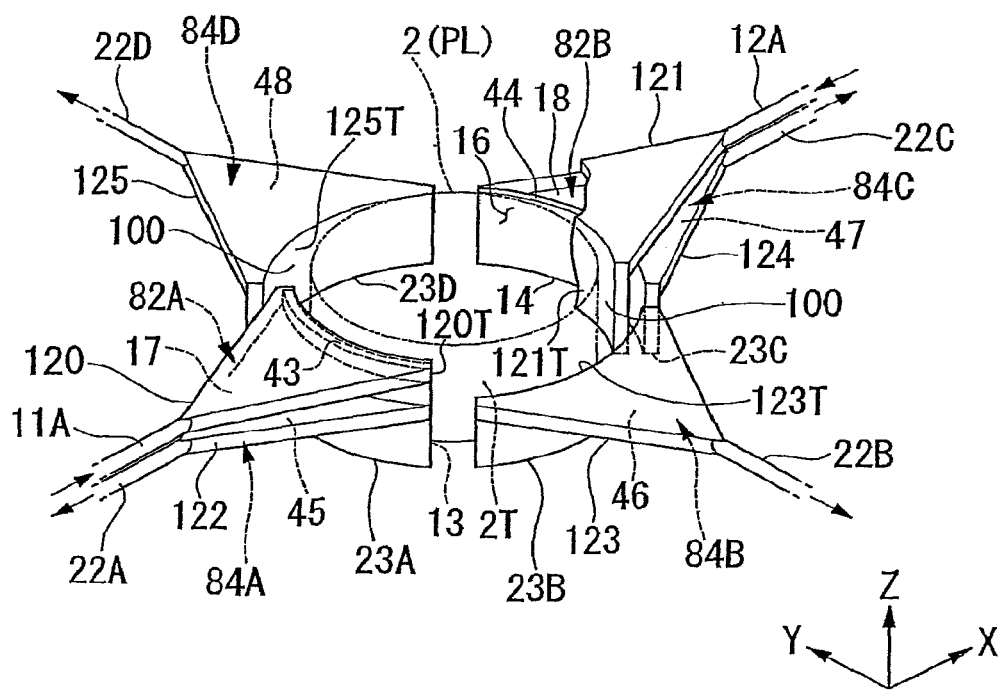
FIG. 17 is an oblique view that shows another embodiment of the liquid supply mechanism and the liquid recovery mechanism.

Note that, in this embodiment, the supply channel 82 that constitutes a portion of the liquid supply mechanism 10 and recovery channel 84 that constitutes a portion of the liquid recovery mechanism 20 are respectively provided as a unit inside the channel formation portion 30, but, as shown in FIG. 17, the supply channel 82 and the recovery channel 84 may also be formed by mutually different members. In FIG. 17, a first supply member 120 that forms a supply channel 82A is provided on the −X side of the projection optical system PL (optical element 2), and a second supply member 121 that forms a supply channel 82B is provided on the +X side. The respective first and second supply members 120, 121 have tapered groove portions 17, 18 and bank portions 43, 44, and liquid 1 is supplied onto the substrate P by means of supply ports 13, 14 that are approximately arc-shaped in a planar view. In addition, the first and third recovery members 122, 124 that form recovery channels 84A, 84C are provided at the −X side and +X side of the projection optical system PL respectively, and the second and fourth recovery members 123, 125 that form recovery channels 84B, 84D are provided at the −Y side and +Y side respectively. The respective first through fourth recovery members 122 to 125 recover the liquid 1 on the substrate P by means of recovery ports 23A to 23D, which are arc-shaped in a planar view. In this case as well, in addition to a minute gap 100 being formed between the inner side surfaces 120T, 121T of the first and second supply member 120, 121, which constitute the liquid supply mechanism, and the side surface 2T of the optical element 2, a minute gap 100 is also formed between the inner side surfaces 123T, 125T of the second and fourth recovery member 123, 125, which constitute the liquid recovery mechanism, and the side surface 2T of the optical element 2. Then, liquid repellence treatment is respectively performed on the inner side surfaces 120T, 121T, 123T 125T and the side surface 2T.

Note that, in this embodiment, the supply ports 13, 14, which are arranged so as to oppose the substrate P, and the supply hole portions 15, 16 connected thereto are vertically provided with respect to the surface of the substrate P, and the liquid 1 is supplied to the substrate P from the vertical direction, but supply port 14 and supply hole portion 16 may be formed so that the liquid 1 is supplied to the substrate P from the diagonal direction. In other words, the corner portion 92 may have a configuration that changes the direction of the fluid 1, which has flowed through the buffer space portion 90 in the horizontal direction, to the vertical direction, and it may also have a configuration that changes to a diagonal direction toward the substrate P. In this case as well, after reserving a prescribed amount of liquid 1 in the buffer space portion 90, the liquid 1 is supplied to the substrate P via the narrow channel portion 91, and it is possible to supply the liquid 1 from slit-shaped supply port 14 onto the substrate P while suppressing the generation of bubbles.

Note that the channel formation member 30 is provided in the vicinity of the optical element 2 of the terminating end portion of the projection optical system PL via the minute gap 100, but in the case where the tip side surface of the optical element 2 is covered by the member that holds the optical element 2, liquid repellence treatment should be performed on at least one of the side surface of that member or the side surface 30T of the channel formation member 30.

In addition, in the above embodiment, the side surface 30T of the channel formation member 30 is arranged so as to oppose the side surface 2T of the optical element 2, but in the case where a different member is in opposition to the side surface 2T of the optical element 2, liquid repellence treatment (making liquid repellent) should be performed on at least one of side surface 2T of the optical element 2 or the surface (side surface) of the different member in opposition thereto.

In addition, in the above embodiment, liquid repellence treatment (making liquid repellent) is performed on at least one of the side surface 2T of the optical element 2 of the terminating end of the projection optical system PL and the side surface of the member in opposition thereto, but as is disclosed in PCT International Publication No. WO2004/019128, for example, in the case where the space of the optical path of the mask M side of the optical element of the terminating end of the projection optical system PL is filled with liquid, by performing liquid repellence treatment on at least one of the side surface of the optical element arranged on the mask M side with respect to the terminating end optical element from among the plurality of optical elements constituting the projection optical system PL and the surface (side surface) of the member in opposition thereto, it is possible to prevent liquid from getting into that gap and/or to prevent liquid from remaining in that gap. As far as is permitted by the law of the country specified or selected in this patent application, the disclosures in PCT International Publication No. WO2004/019128 are incorporated herein by reference.

Note that, in this embodiment, the supply ports are formed in a slit shape that has a prescribed length, but it may also be a divided supply port that is plurally divided by a plurality of partition members for example, it may have a configuration in which a plurality of straight tube portions are arrayed, or it may have a configuration in which a straight tube and a slit-shaped supply port are combined. In addition, a porous body such as a sponge-shaped member may also be provided on the supply port. Similarly, a partition member may also be provided on the recovery port, and it may be formed with a plurality of straight tube portions. In addition, a porous body and a partition member or a straight tube portion may be provided on the channel of the supply channel 82 of the channel formation member 30.

Note that, in this embodiment, the configuration is one in which the supply ports 13, 14 of the liquid supply mechanism 10 are provided only on both sides of the scanning direction (X axis direction) with respect to the projection region AR1, but separate supply ports may be provided on both sides of the non-scanning direction (Y axis direction), and this plurality of supply ports may be combined to perform liquid supply. Or, the supply ports may be provided in a ring shape to completely surround the projection region AR1.

Note that, in this embodiment, the configuration is one in which a trap surface 70 is provided only on both sides of the scanning direction of the projection region AR1 on the lower surface of the first member 31, but there may also be a configuration in which it is provided in the non-scanning direction with respect to the projection region AR1. On the other hand, because the liquid 1 flows out easily on both sides of the scanning direction, even if it is a configuration in which a trap surface 70 is provided only on both sides of the scanning direction of the projection region AR1, it is possible to capture well the liquid 1 that is attempting to flow out. In addition, it is not necessary for the trap surface 70 to be a flat surface, for example, it may be of a shape in which a plurality of flat surfaces is combined. Or, the trap surface 70 may have a curved surface shape, and surface area expansion processing, specifically rough surface processing, may also be performed.

Note that, in the above embodiment, it is possible to perform lyophilic processing on the surface of the channels of the liquid supply mechanism 10 and the liquid recovery mechanism 20 through which the liquid 1 flows. In particular, by performing lyophilic processing on the recovery channel 84 that includes recovery port 23 of the liquid recovery mechanism 20, it is possible to perform liquid recovery smoothly. In addition, it is also possible to perform lyophilic processing to the supply ports and the supply channels of the liquid supply mechanism 10.

In the above embodiment, the liquid 1 is comprised of pure water. Pure water has advantages in that it can be easily obtained in large quantity at semiconductor manufacturing plants, etc. and in that it has no adverse effects on the photoresist on the substrate P or on the optical elements (lenses), etc. In addition, pure water has no adverse effects on the environment and contains very few impurities, so one can also expect an action whereby the surface of the substrate P and the surface of the optical element provided on the front end surface of the projection optical system PL are cleaned.

In addition, the index of refraction n of pure water (water) with respect to exposure light EL with a wavelength of 193 nm is nearly 1.44, so in the case where ArF excimer laser light (193 nm wavelength) is used as the light source of the exposure light EL, it is possible to shorten the wavelength to 1/n, that is, approximately 134 nm on the substrate P, to obtain high resolution. Also, the depth of focus is expanded by approximately n times, that is approximately 1.44 times, compared with it being in air, so in the case where it would be permissible to ensure the same level of depth of focus as the case in which it is used in air, it is possible to further increase the numerical aperture of the projection optical system PL, and resolution improves on this point as well.

In this embodiment, an optical element 2 is attached to the tip end of the projection optical system PL, and this lens can be used to adjust the optical characteristics, for example, the aberration (spherical aberration, coma aberration, etc.), of the projection optical system PL. Note that an optical plate used for the adjustment of the optical characteristics of the projection optical system PL may also be used as the optical element attached to the tip end of the projection optical system PL. Or, it may also be a plane-parallel plate through which the exposure light EL is able to pass.

Note that in the case where the pressure between the substrate P and the optical element of the tip end of the projection optical system PL arising from the flow of the liquid 1 is large, it is permissible to make that optical element not one that is replaceable but one that is firmly secured so that the optical element does not move due to that pressure.

Note that, in this embodiment, the configuration is one in which a liquid 1 is filled between the projection optical system PL and the surface of the substrate P, but it may also be a configuration in which the liquid 1 is filled in a status in which cover glass consisting of plane-parallel plate is attached to the surface of the substrate P, for example.

Note that the liquid 1 of this embodiment is water, but it may be a liquid other than water. For example, if the light source of the exposure light EL is an $F_2$ laser, this $F_2$ laser light will not pass through water, so the liquid 1 may be, for example, a fluorocarbon oil or a perfluoropolyether (PFPE) fluorocarbon fluid that an $F_2$ laser is able to pass through. In addition, it is also possible to use, as the liquid 1, liquids that have the transmittance with respect to the exposure light EL and whose refractive index are as high as possible and that are stable with respect to the photoresist coated on the projection optical system PL and the surface of the substrate P (for example, cedar oil).

In this case as well, surface treatment is performed according to the polarity of the liquid 1 used.

Applicable as the substrate P of the aforementioned respective embodiments are not only a semiconductor wafer for the manufacture of semiconductor devices but glass substrates for display devices, ceramic wafers for thin film magnetic heads, original plates (synthetic quartz, silicon wafer) of masks or reticles used in exposure apparatuses, and the like.

Applicable as the exposure apparatus EX are, in addition to step and scan system scanning exposure apparatuses (scanning steppers) that move the mask M and the substrate P in synchronization and scan-expose the pattern of a mask M, step and repeat system projection exposure apparatuses (steppers) that exposes the pattern on the mask M all at once in a status in which the mask M and the substrate P have been made stationary and sequentially step-move the substrate P. In addition, the present invention is also applicable to step and switch system exposure apparatuses that partially overlay and transfer at least two patterns on the substrate P.

In addition, the present invention can also be applied to twin stage exposure apparatuses that separately mount the substrate to be treated, such as a wafer, and are provided with two independently movable stages in the XY direction. The structure and the exposure operation of the twin stage exposure apparatus are disclosed in, for example, Japanese Unexamined Patent Application, First Publication No. H10-163099, Japanese Unexamined Patent Application, First Publication No. H10-214783 (corresponding U.S. Pat. Nos. 6,341,007, 6,400,441, 6,549,269 and 6,590,634), Published Japanese Translation No. 2000-505958 of the PCT International Application (corresponding U.S. Pat. No. 5,969,441), and U.S. Pat. No. 6,208,407. As far as is permitted, the disclosures in the above-mentioned Japan patent applications and the U.S. patents are incorporated herein by reference.

The types of exposure apparatuses EX are not limited to exposure apparatuses for semiconductor element manufacture that exposes a semiconductor element pattern onto a substrate P but are also widely applicable to exposure apparatuses for the manufacture of liquid crystal display elements and for the manufacture of displays, and exposure apparatuses for the manufacture of thin film magnetic heads, image pickup elements (CCD) and reticles or masks.

In the case where a linear motor is used in the substrate stage PST or the mask stage MST, an air floating type that uses air bearings or a magnetic levitation type that uses Lorentz's force or reactance force may be used. In addition, the respective stages PST, MST may be the types that move along a guide or may be the guideless type in which a guide is not provided. Examples that use a linear motor for the stage are disclosed in U.S. Pat. Nos. 5,623,853 and 5,528,118. As far as is permitted, the disclosures in U.S. Pat. Nos. 5,623,853 and 5,528,118 are incorporated herein by reference.

For the drive mechanisms of the respective stages PST, MST, a planar motor that places in opposition a magnet unit that two-dimensionally arranges magnets and an armature unit that arranges coils two-dimensionally and drives the respective stages PST, MST by electromagnetic force may be used. In such a case, either the magnet unit or the armature unit is connected to the stage PST, MST, and the other from among the magnet unit and the armature unit may be provided on the moving surface side of the stage PST, MST.

The reaction force generated by the movement of the substrate stage PST may be caused to mechanically escape to the floor (ground) using a frame member so that it is not transmitted to the projection optical system PL. This reaction force handling method is disclosed in detail in, for example, U.S. Pat. No. 5,528,118 (Japanese Unexamined Patent Application, First Publication No. H8-166475). As far as is permitted, the disclosures in the above-mentioned U.S. Patents, as well as the Japan Patent Applications are incorporated herein by reference.

The reaction force generated by the movement of the MASK stage MST may be caused to mechanically escape to the floor (ground) using a frame member so that it is not transmitted to the projection optical system PL. This reaction force handling method is disclosed in detail in, for example, U.S. Pat. No. 5,874,820 (Japanese Unexamined Patent Application, First Publication No. H8-330224). As far as is permitted, the disclosures in the above-mentioned U.S. Patents, as well as the Japan Patent Applications are incorporated herein by reference.

The exposure apparatus EX of this embodiment is manufactured by assembling various subsystems, including the respective constituent elements presented in the Scope of Patents Claims of the present application, so that the prescribed mechanical precision, electrical precision and optical precision can be maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems.

The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly to the exposure apparatuses of the various subsystems has ended, overall assembly is performed, and the various precisions are ensured for the exposure apparatus as a whole. Note that it is preferable that the manufacture of the exposure apparatus be performed in a clean room in which the temperature, the degree of cleanliness, etc. are controlled.

Figure 18:
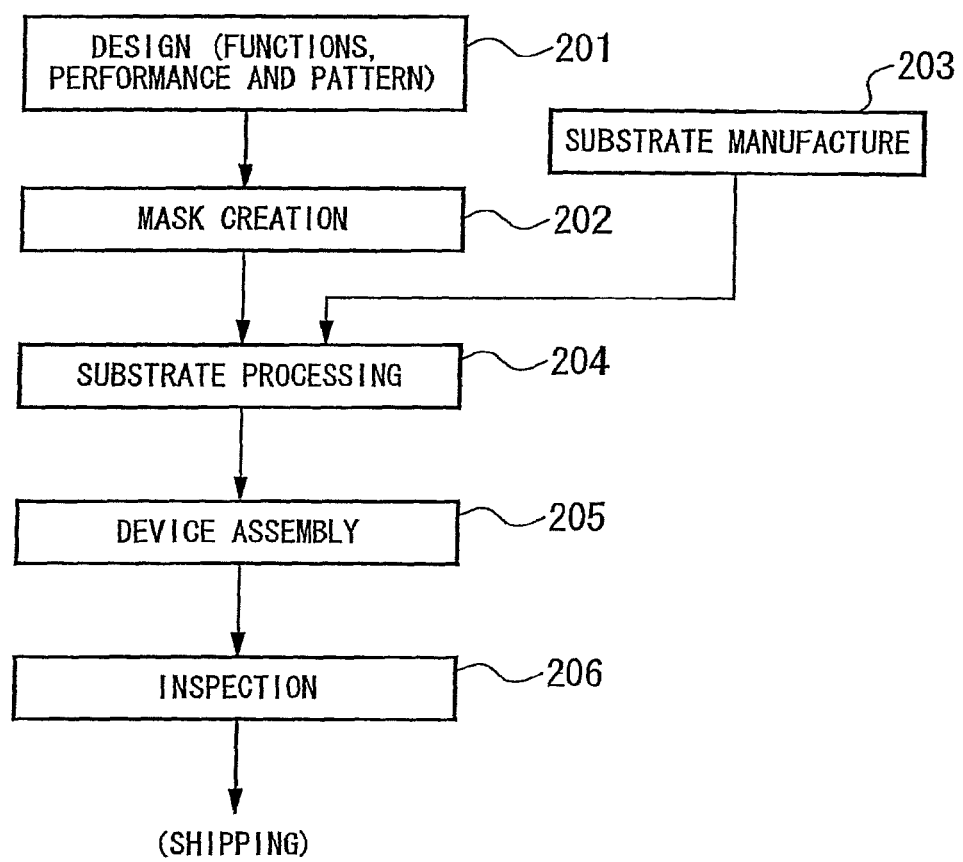
FIG. 18 is a flow chart that shows an example of the manufacturing process of the semiconductor device.

As shown in FIG. 18, microdevices such as semiconductor devices are manufactured by going through a step 201 that performs microdevice function and performance design, a step 202 that creates the mask (reticle) based on this design step, a step 203 that manufactures the substrate that is the device base material, a substrate processing step 204 that exposes the pattern on the mask onto a substrate by means of the exposure apparatus EX of the aforementioned embodiment, a device assembly step (including the dicing process, bonding process and packaging process) 205, an inspection step 206, etc.

The present invention is an exposure apparatus that, by forming a liquid immersion region on a portion of the substrate and projecting the pattern image onto the substrate via the liquid that forms the liquid immersion region and a projection optical system, exposes the substrate, it is provided with a liquid supply mechanism that has a supply port arranged to oppose the surface of the substrate, a buffer space is formed in the channel of the liquid supply mechanism, and supply of the liquid to the supply port is started after reserving a prescribed amount or more of liquid in the buffer space, so it is possible to evenly supply liquid onto the substrate while preventing mixing in of bubbles and impurities, and it is therefore possible to prevent deterioration of the pattern image and perform exposure with good accuracy.

What is claimed is:

1. A device manufacturing method comprising:
    forming a liquid immersion area under a projection optical system via which an exposure light is projected, while supplying a liquid via a liquid supply inlet of a liquid retaining member and collecting the supplied liquid along with a gas via a liquid recovery outlet of the liquid retaining member, the liquid retaining member surrounding a tip portion of the projection optical system, the projection optical system having a last optical element having a surface, and the liquid retaining member having a surface opposite to the surface of the last optical element with a gap between the surfaces;
    exposing a substrate with the exposure light through the liquid of the liquid immersion area which covers a portion of an upper surface of the substrate, while moving the substrate below and relative to the liquid retaining member and the projection optical system including the last optical element of the projection optical system; and
    separating one of the liquid and the gas from the other which have been collected via the liquid recovery outlet.

2. The method according to claim 1, wherein:
    the liquid on the upper surface of the substrate is collected via the liquid recovery outlet facing the upper surface of the substrate from above the substrate.

3. The method according to claim 2, wherein:
    the liquid is supplied onto the upper surface of the substrate via the liquid supply inlet facing the upper surface of the substrate from above the substrate.

4. The method according to claim 2, wherein the liquid is supplied via the liquid supply inlet, the liquid supply inlet being located between the liquid recovery outlet and a path of the exposure light.

5. The method according to claim 1, wherein
the liquid collected via the liquid recovery outlet is moved to a tank of a separator.

6. The method according to claim 5, further comprising: sucking the gas from an upper gas portion in the tank.

7. The method according to claim 5, further comprising: discharging the liquid from a lower liquid portion in the tank.

8. The method according to claim 6, wherein the separator is arranged between the liquid recovery outlet and a vacuum system.

9. The method according to claim 8, wherein the vacuum system is connected to the upper gas portion in the tank.

10. The method according to claim 5, wherein the separator separates one of the gas and the liquid from the other.

11. The method according to claim 5, wherein the liquid is collected from the liquid recovery outlet by controlling a pressure in the tank.

12. The method according to claim 1, wherein no portion of the liquid retaining member contacts the projection optical system.

13. The method according to claim 4, wherein the liquid immersion area is formed on the portion of the upper surface of the substrate, while supplying the liquid from the liquid supply inlet and collecting the liquid from the liquid recovery outlet.

14. The method according to claim 13, wherein:
the liquid retaining member has an aperture via which the exposure light is projected, and
the liquid supply inlet has a plurality of liquid supply openings arranged to surround the aperture and the liquid recovery outlet has a plurality of liquid recovery openings arranged to surround the aperture.

15. The method according to claim 1, wherein each of a plurality of shot areas of the substrate is exposed with the exposure light via the liquid immersion area covering the portion of the upper surface of the substrate, while moving the substrate in a scanning direction relative to the projection optical system.

16. The method according to claim 15, wherein one of the shot areas is exposed while moving the substrate in a first scanning direction and another one of the shot areas is exposed while moving the substrate in a second scanning direction opposite to the first scanning direction.

* * * * *